US012308089B2

United States Patent
Kim et al.

(10) Patent No.: US 12,308,089 B2
(45) Date of Patent: May 20, 2025

(54) SEMICONDUCTOR MEMORY DEVICES

(71) Applicant: Samsung Electronics Co., Ltd., Suwon-si (KR)

(72) Inventors: Jongcheol Kim, Suwon-si (KR); Hyunsung Shin, Suwon-si (KR); Hohyun Shin, Suwon-si (KR); Taeyoung Oh, Suwon-si (KR); Kyungsoo Ha, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/771,859

(22) Filed: Jul. 12, 2024

(65) Prior Publication Data

US 2024/0371417 A1 Nov. 7, 2024

Related U.S. Application Data

(63) Continuation of application No. 18/169,769, filed on Feb. 15, 2023, now Pat. No. 12,073,910.

(30) Foreign Application Priority Data

Jul. 11, 2022 (KR) .......................... 10-2022-0084779

(51) Int. Cl.
*G11C 7/10* (2006.01)
*G06F 3/06* (2006.01)
(Continued)

(52) U.S. Cl.
CPC .......... *G11C 7/1012* (2013.01); *G06F 3/0619* (2013.01); *G11C 11/4093* (2013.01);
(Continued)

(58) Field of Classification Search
CPC .............. G11C 7/1012; G11C 11/4096; G11C 11/4093; G11C 2207/005
See application file for complete search history.

(56) References Cited

U.S. PATENT DOCUMENTS

| 6,556,950 B1 * | 4/2003 | Schwenke .............. G05B 17/02 |
| | | 700/86 |
| 10,268,541 B2 | 4/2019 | Niu et al. |

(Continued)

FOREIGN PATENT DOCUMENTS

| JP | 2022-056987 | 4/2022 |
| KR | 10-2020-0074467 | 6/2020 |

(Continued)

*Primary Examiner* — Joseph D Torres
(74) *Attorney, Agent, or Firm* — Fish & Richardson P.C.

(57) ABSTRACT

A semiconductor memory device includes a memory cell array, a data input/output (I/O) buffer, an I/O gating circuit and a control logic circuit. The memory cell array includes a plurality of sub array blocks arranged in a first direction and a second direction. The data I/O buffer exchanges user data with a memory controller through I/O pads. The I/O gating circuit is connected to the data I/O buffer through data buses and connected to the memory cell array through data I/O lines, and programs mapping relationship between the sub array blocks and the I/O pads, based on a mapping control signal such that uncorrectable errors that are detected by an error correction code engine in the memory controller are reduced. The control logic circuit generates the mapping control signal based on identifier information indicating a type of a central processing unit of the memory controller.

20 Claims, 29 Drawing Sheets

(51) Int. Cl.
  *G11C 11/4093* (2006.01)
  *G11C 11/4096* (2006.01)
  *G06F 11/10* (2006.01)
  *G11C 11/408* (2006.01)

(52) U.S. Cl.
  CPC ........ *G11C 11/4096* (2013.01); *G06F 3/0659* (2013.01); *G06F 3/0679* (2013.01); *G06F 11/1068* (2013.01); *G11C 11/4082* (2013.01); *G11C 2207/005* (2013.01)

(56) References Cited

U.S. PATENT DOCUMENTS

| | | | |
|---|---|---|---|
| 10,867,655 B1 * | 12/2020 | Harms | G11C 29/52 |
| 10,922,171 B2 | 2/2021 | Cho et al. | |
| 11,068,347 B2 | 7/2021 | Kim et al. | |
| 11,249,844 B2 | 2/2022 | Song et al. | |
| 2012/0300555 A1 * | 11/2012 | Shin | G11C 5/04 |
| | | | 365/191 |
| 2014/0331101 A1 * | 11/2014 | Chung | G06F 11/1008 |
| | | | 714/755 |
| 2015/0169333 A1 * | 6/2015 | Jung | G06F 9/4401 |
| | | | 713/2 |
| 2015/0221361 A1 * | 8/2015 | Lee | G11C 29/44 |
| | | | 365/96 |
| 2021/0133028 A1 * | 5/2021 | Kim | G06F 11/1048 |
| 2022/0093202 A1 | 3/2022 | Wadhawan et al. | |
| 2022/0093203 A1 | 3/2022 | Kim et al. | |

FOREIGN PATENT DOCUMENTS

| | | | | |
|---|---|---|---|---|
| KR | 10-2021-0051668 | | 5/2021 | |
| KR | 20210051668 A | * | 5/2021 | .......... G06F 11/1004 |

* cited by examiner

MAPC1

| SWD | DQ0 ~DQ3 | | DQ0 ~DQ3 | | DQ0 ~DQ3 | | DQ0 ~DQ3 | | DQ4 ~DQ7 | | DQ4 ~DQ7 | | DQ4 ~DQ7 | | DQ4 ~DQ7 | |
|---|---|---|---|---|---|---|---|---|---|---|---|---|---|---|---|---|
| DQ0 ~DQ3 | BL0 BL7 | SWD | BL1 BL6 | SWD | BL3 BL4 | SWD | BL2 BL5 | SWD | BL0 BL7 | SWD | BL1 BL6 | SWD | BL3 BL4 | SWD | BL2 BL5 | SWD |
| | DQ0 ~DQ3 | | DQ0 ~DQ3 | | DQ0 ~DQ3 | | DQ0 ~DQ3 | | DQ4 ~DQ7 | | DQ4 ~DQ7 | | DQ4 ~DQ7 | | DQ4 ~DQ7 | |

FIG. 16

MAPC2

| | SWD | |
| --- | --- | --- |
| DQ5 | BL0 ~BL7 | DQ5 |
| | SWD | |
| DQ7 | BL0 ~BL7 | DQ7 |
| | SWD | |
| DQ4 | BL0 ~BL7 | DQ4 |
| | SWD | |
| DQ6 | BL0 ~BL7 | DQ6 |
| | SWD | |
| | SWD | |
| DQ1 | BL0 ~BL7 | DQ1 |
| | SWD | |
| DQ3 | BL0 ~BL7 | DQ3 |
| | SWD | |
| DQ0 | BL0 ~BL7 | DQ0 |
| | SWD | |
| DQ2 | BL0 ~BL7 | DQ2 |
| | SWD | |

FIG. 17

MAPC3

| | DQ0<br>~DQ3 | | DQ0<br>~DQ3 | | DQ0<br>~DQ3 | | DQ0<br>~DQ3 | | | DQ4<br>~DQ7 | | DQ4<br>~DQ7 | | DQ4<br>~DQ7 | | DQ4<br>~DQ7 | |
|---|---|---|---|---|---|---|---|---|---|---|---|---|---|---|---|---|---|
| SWD | BL0 | SWD | BL1 | SWD | BL3 | SWD | BL2 | SWD | SWD | BL7 | SWD | BL6 | SWD | BL4 | SWD | BL5 | SWD |
| | DQ0<br>~DQ3 | | DQ0<br>~DQ3 | | DQ0<br>~DQ3 | | DQ0<br>~DQ3 | | | DQ4<br>~DQ7 | | DQ4<br>~DQ7 | | DQ4<br>~DQ7 | | DQ4<br>~DQ7 | |

| | DQ0 | DQ1 | DQ2 | DQ3 | DQ4 | DQ5 | DQ6 | DQ7 |
|---|---|---|---|---|---|---|---|---|
| BL0 | ▨ | ▨ | ▨ | ▨ | | | | |
| BL1 | ▨ | ▨ | ▨ | ▨ | | | | |
| BL2 | | | | | | | | |
| BL3 | | ▨ | ▨ | ▨ | | | | |
| BL4 | ▨ | ▨ | ▨ | ▨ | | | | |
| BL5 | | | | | | | | |
| BL6 | ▨ | ▨ | ▨ | | | | | |
| BL7 | ▨ | ▨ | ▨ | ▨ | | | | |

☐ : NO ERROR
▨ : ERROR BY 511
▧ : ERROR BY 513

FIG. 20

MAPC2

| | DQ2 | | DQ0 | | DQ3 | | DQ1 | | DQ6 | | DQ4 | | DQ7 | | DQ5 | |
|---|---|---|---|---|---|---|---|---|---|---|---|---|---|---|---|---|
| | BL0~BL7 | SWD | BL0~BL7 | SWD | BL0~BL7 | SWD | BL0~BL7 | SWD | BL0~BL7 | SWD | BL0~BL7 | SWD | BL0~BL7 | SWD | BL0~BL7 | SWD |
| SWD | DQ2 | | DQ0 | | DQ3 | | DQ1 | | DQ6 | | DQ4 | | DQ7 | | DQ5 | |

|      | DQ0 | DQ1 | DQ2 | DQ3 | DQ4 | DQ5 | DQ6 | DQ7 |
|------|-----|-----|-----|-----|-----|-----|-----|-----|
| BL0  | ▨   |     | ▨   | ▧   |     |     |     |     |
| BL1  | ▨   |     | ▨   | ▧   |     |     |     |     |
| BL2  | ▨   |     | ▨   | ▧   |     |     |     |     |
| BL3  | ▨   |     | ▨   | ▧   |     |     |     |     |
| BL4  | ▨   |     | ▨   | ▧   |     |     |     |     |
| BL5  | ▨   |     | ▨   | ▧   |     |     |     |     |
| BL6  | ▨   |     | ▨   | ▧   |     |     |     |     |
| BL7  | ▨   |     | ▨   | ▧   |     |     |     |     |

☐ : NO ERROR
▨ : ERROR BY 521
▧ : ERROR BY 523

SEMICONDUCTOR MEMORY DEVICES

CROSS-REFERENCE TO RELATED APPLICATIONS

This application is a continuation of U.S. patent application Ser. No. 18/169,769 filed Feb. 15, 2023, which claims priority under 35 U.S.C. § 119 to Korean Patent Application No. 10-2022-0084779, filed on Jul. 11, 2022, the disclosures of which are incorporated herein by reference in its entirety.

TECHNICAL FIELD

Example implementations of the present disclosure relate to memories, and more particularly, to semiconductor memory devices and memory modules.

DISCUSSION OF THE RELATED ART

A memory device may be implemented using a semiconductor such as silicon (Si), germanium (Ge), gallium arsenide (GaAs), indium phosphide (InP), or the like. Memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, or the like of a computing system.

A plurality of memory chips (e.g., DRAM) are implemented with a memory module for high performance and large volume.

SUMMARY

Example implementations provide a memory controller capable of programming a mapping relationship according to a type of a central processing unit (CPU) of a memory controller.

Example implementations provide a memory module capable of programming a mapping relationship according to a type of a CPU of a memory controller.

According to some example implementations, a semiconductor memory device includes a memory cell array, a data input/output (I/O) buffer, an I/O gating circuit and a control logic circuit. The memory cell array includes a plurality of sub array blocks arranged in a first direction and a second direction crossing the first direction and each of the plurality of sub array blocks includes a plurality of memory cells. The data I/O buffer exchanges user data with an external memory controller through a plurality of I/O pads. The I/O gating circuit is connected to the data I/O buffer through a plurality of data buses and connected to the memory cell array through a plurality of data I/O lines, receives a mapping control signal and based on the mapping control signal, sets a mapping relationship between the plurality of sub array blocks in which the user data is stored and the plurality of I/O pads through which the user data is transferred. The control logic circuit generates the mapping control signal based on identifier information indicating a type of a central processing unit (CPU) of the memory controller.

According to some example implementations, a memory module includes a plurality of data memories, a first error correction code (ECC) memory and a second ECC memory. Each of the plurality of data memories stores a user data included in a user data set. The first ECC memory stores cyclic redundancy check (CRC) data generated based on the user data set. Each data memory of the plurality of data memories, based on identifier information characterizing a central processing unit (CPU) of a memory controller, sets a mapping relationship between (i) a plurality of sub array blocks of the data memory, in which the data of the data memory is stored, and (ii) a plurality of I/O pads of the data memory, through which the data memory is connected to the memory controller and the data is transferred.

According to some example implementations, a semiconductor memory device includes a memory cell array, a data input/output (I/O) buffer, an I/O gating circuit and a control logic circuit. The memory cell array includes a plurality of sub array blocks arranged in a first direction and a second direction crossing the first direction and each of the plurality of sub array blocks includes a plurality of memory cells. The data I/O buffer exchanges user data with an external memory controller through a plurality of I/O pads. The I/O gating circuit is connected to the data I/O buffer through a plurality of data buses and connected to the memory cell array through a plurality of data I/O lines, and programs mapping relationship between the plurality of sub array blocks in which the user data is stored and the plurality of I/O pads through which the user data is input/output, based on a mapping control signal such that uncorrectable errors that are detected by an error correction code (ECC) engine in the memory controller are reduced. The control logic circuit generates the mapping control signal based on identifier information indicating a type of a central processing unit (CPU) of the memory controller. The I/O gating circuit includes a first driver and a second driver. The first driver connects a first data I/O line from among the plurality of data I/O lines to a first data bus from among the plurality of data buses according to a first mapping relationship. The second driver connects the first data I/O line to a second data bus, different from the first data bus, from among the plurality of data buses according to a second mapping relationship different from the first mapping relationship.

According to example implementations, since the semiconductor memory device according to example implementations may program mapping configuration which the CPU uses in the I/O gating circuit based on the identifier information of the CPU of the memory controller, the data memory may handle at least two different mapping configuration with one core structure and may reduce uncorrectable errors detected by an ECC engine of the memory controller.

BRIEF DESCRIPTION OF THE DRAWINGS

The above and other features of the present disclosure will become more apparent by describing in detail example implementations thereof with reference to the accompanying drawings.

FIG. 8 is a diagram illustrating a data structure in which an error correction algorithm is performed according to example implementations.

Each of FIGS. 15, 16 and 17 illustrates mapping configuration between data bits input through I/O pads during burst lengths and sub array block in which the data bits are stored.

Figure 18:
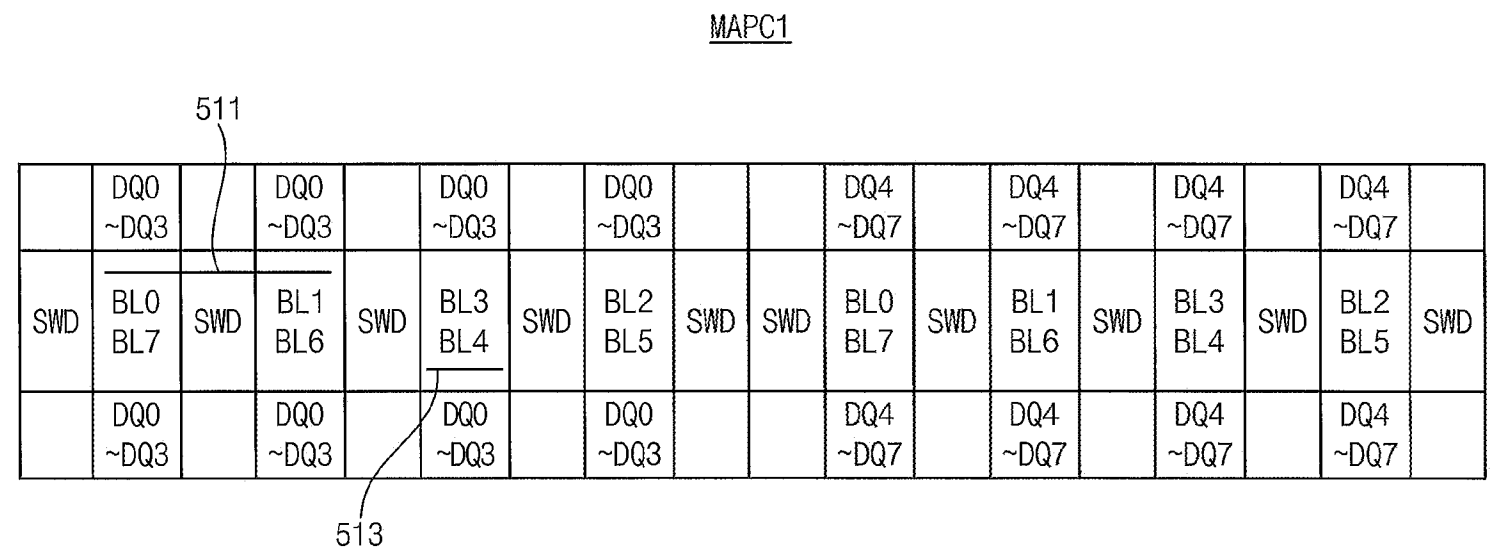

FIG. 18 illustrates defects that may occur in the mapping configuration in FIG. 15.

FIG. 19 illustrates errors that may occur due to the defects in FIG. 18.

FIG. 20 illustrates defects that may occur in the mapping configuration in FIG. 16.

FIG. 21 illustrates errors that may occur due to the defects in FIG. 20.

Figure 11:
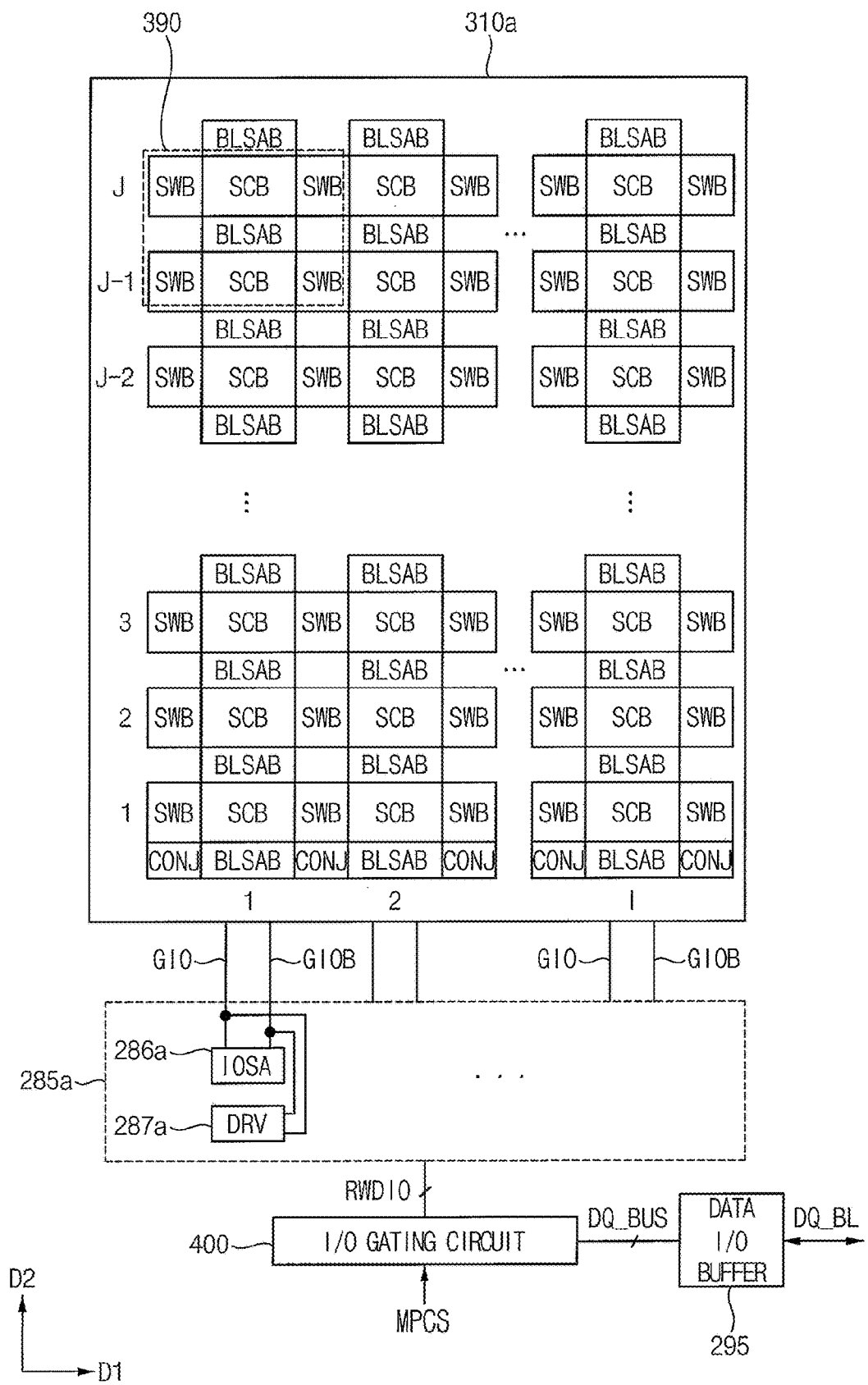
FIG. 11 illustrates a portion of the data memory of FIG. 7 according to some example implementations.
Figure 22:
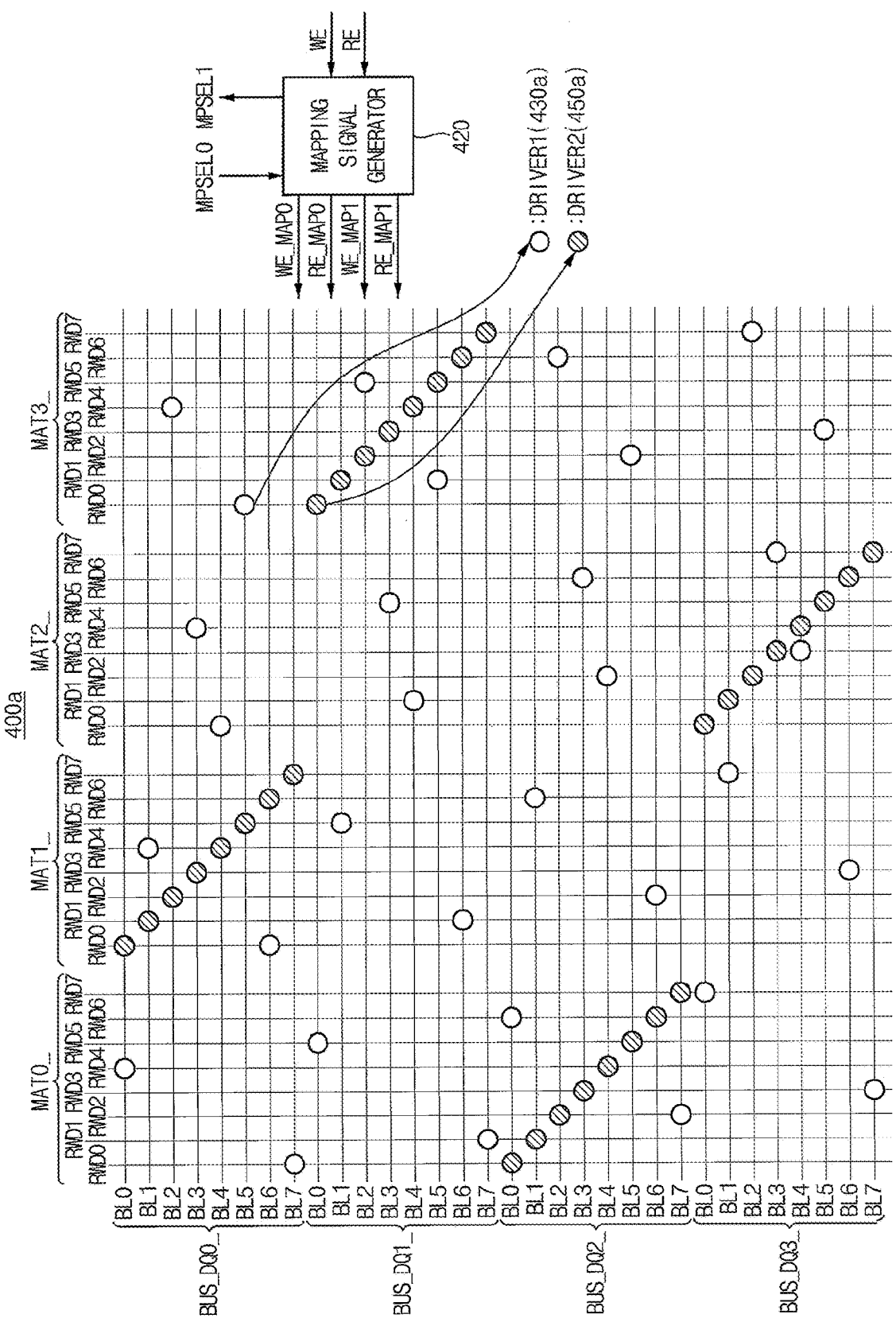

FIG. 22 illustrates an example of the I/O gating circuit in the data memory of FIG. 11 according to example implementations.

Figure 23:
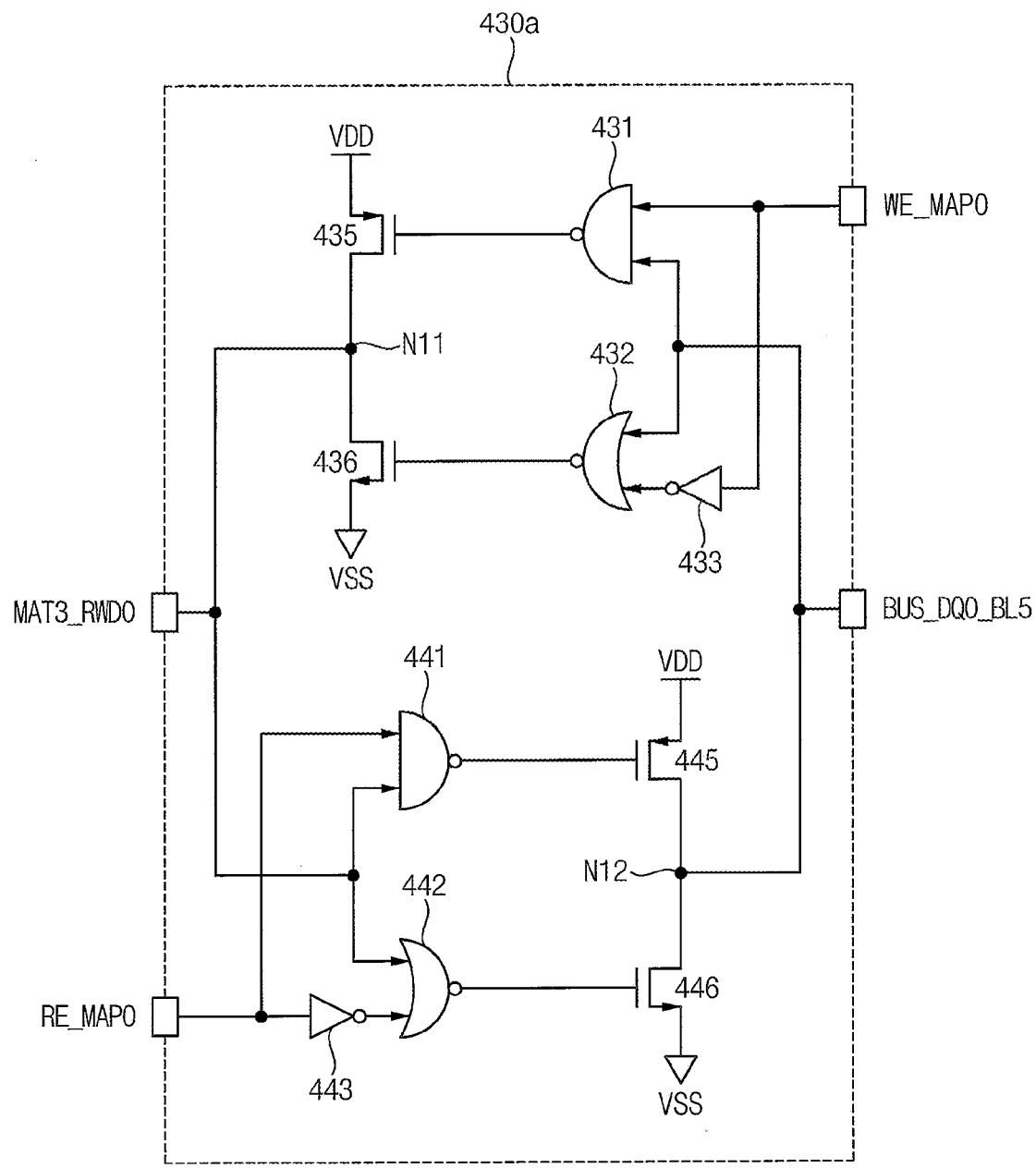

FIG. 23 is a circuit diagram illustrating an example of the first driver in the I/O gating circuit of FIG. 22 according to example implementations.

Figure 24:
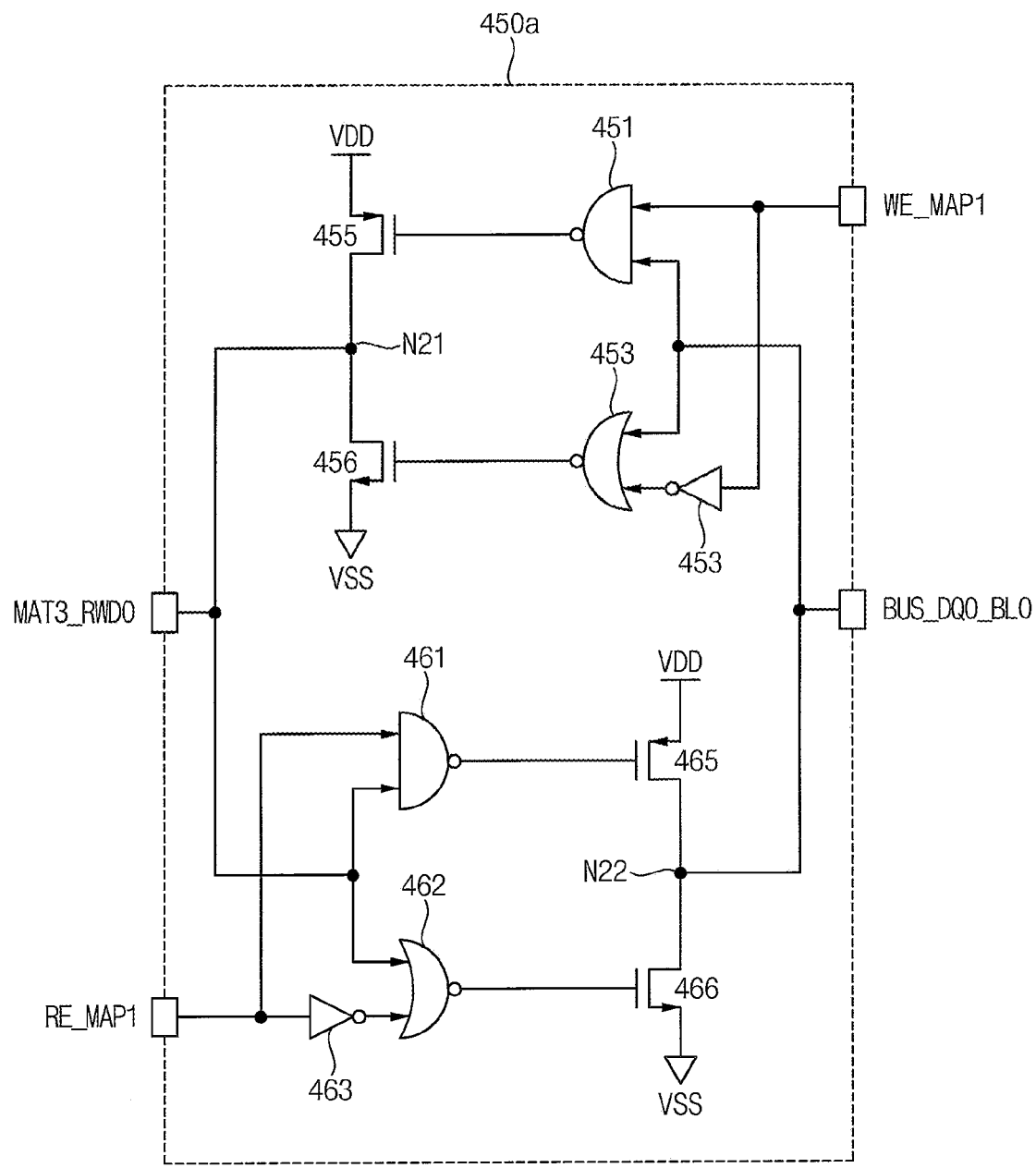

FIG. 24 is a circuit diagram illustrating an example of the second driver in the I/O gating circuit of FIG. 22 according to example implementations.

Figure 25:
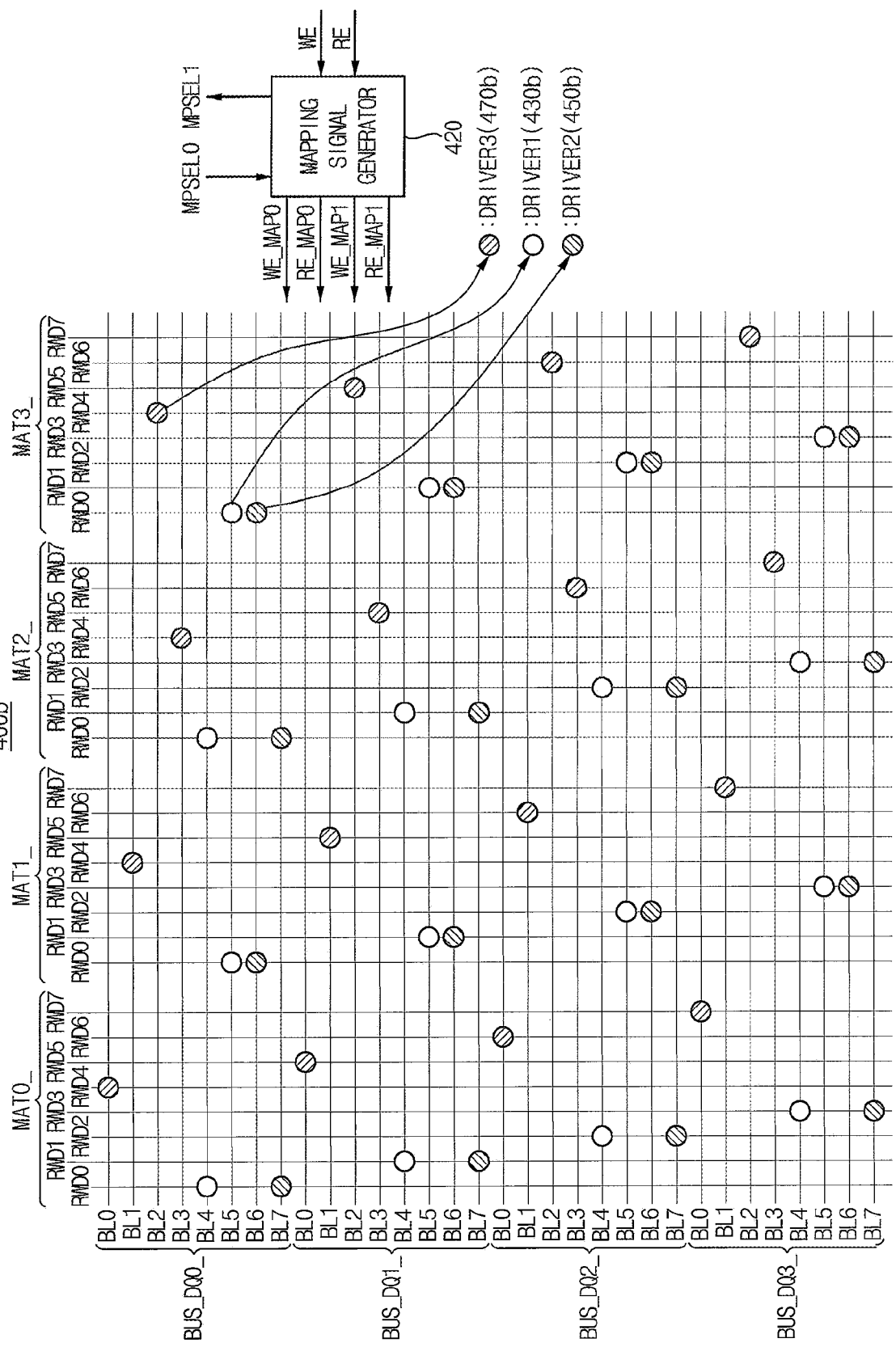

FIG. 25 illustrates an example of the I/O gating circuit in the data memory of FIG. 11 according to example implementations.

Figure 26:
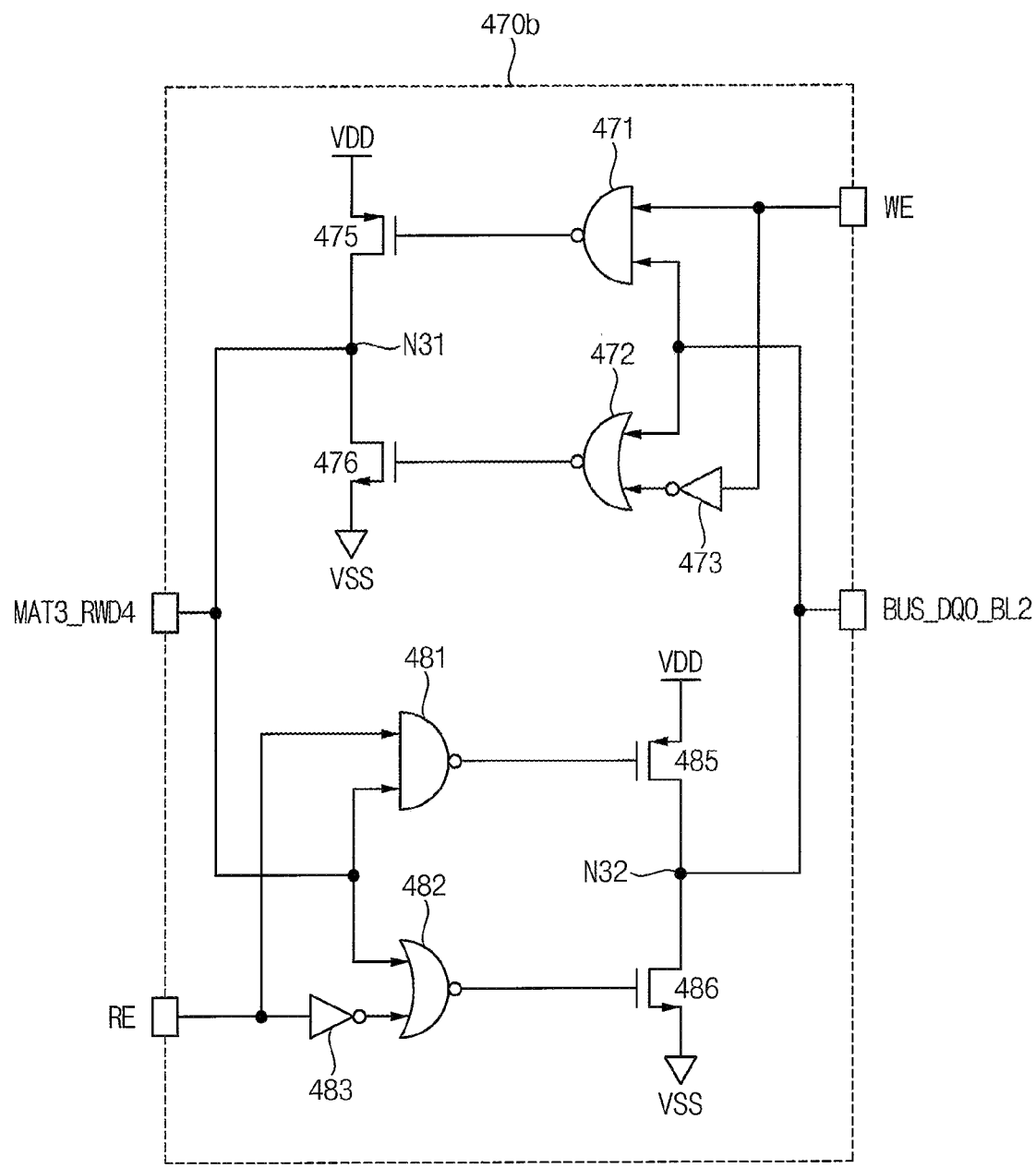

FIG. 26 is a circuit diagram illustrating an example of the third driver in the I/O gating circuit of FIG. 25 according to example implementations.

Figure 1:
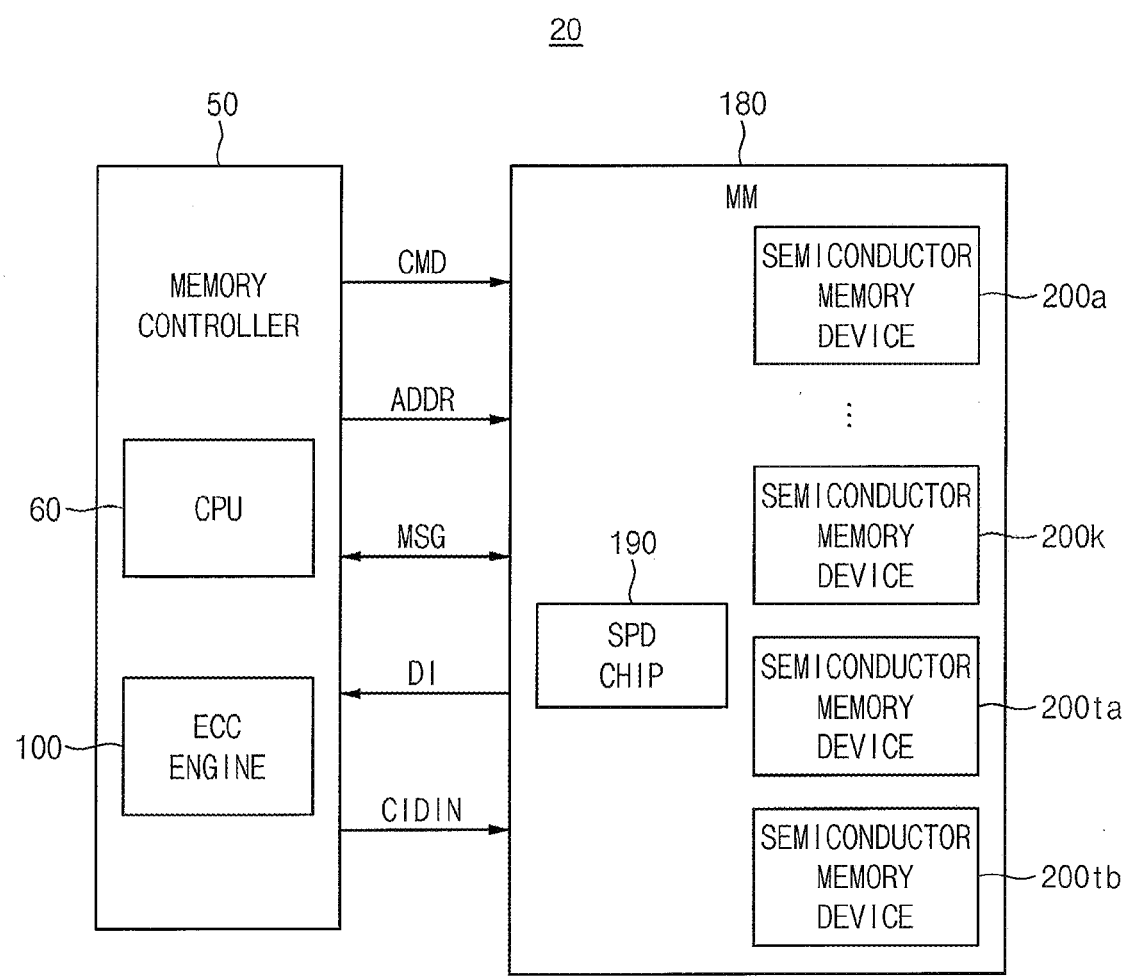
FIG. 1 is a block diagram illustrating a memory system according to example implementations.
Figure 27:
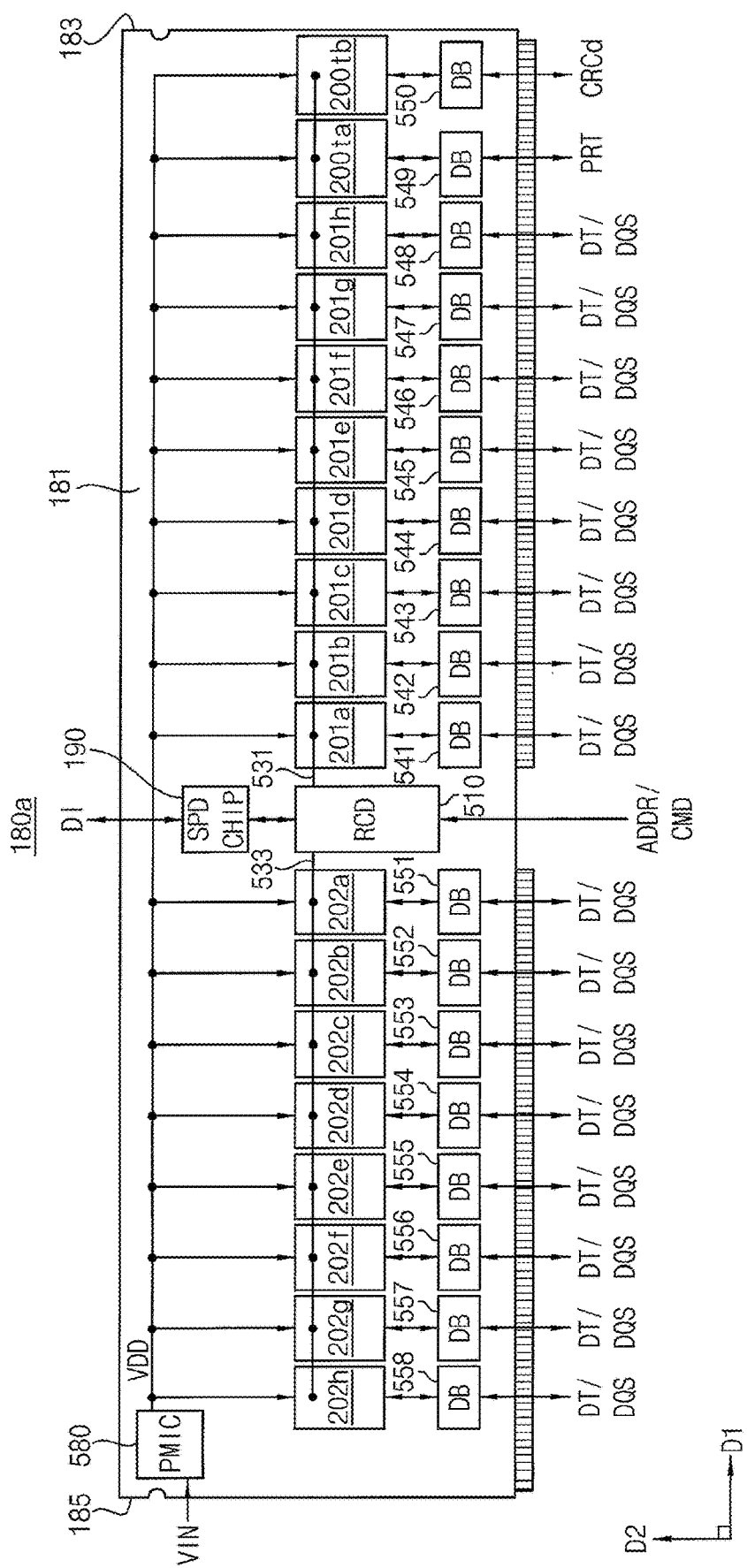

FIG. 27 is a block diagram illustrating an example of the memory module in the memory system of FIG. 1 according to example implementations.

Figure 28:
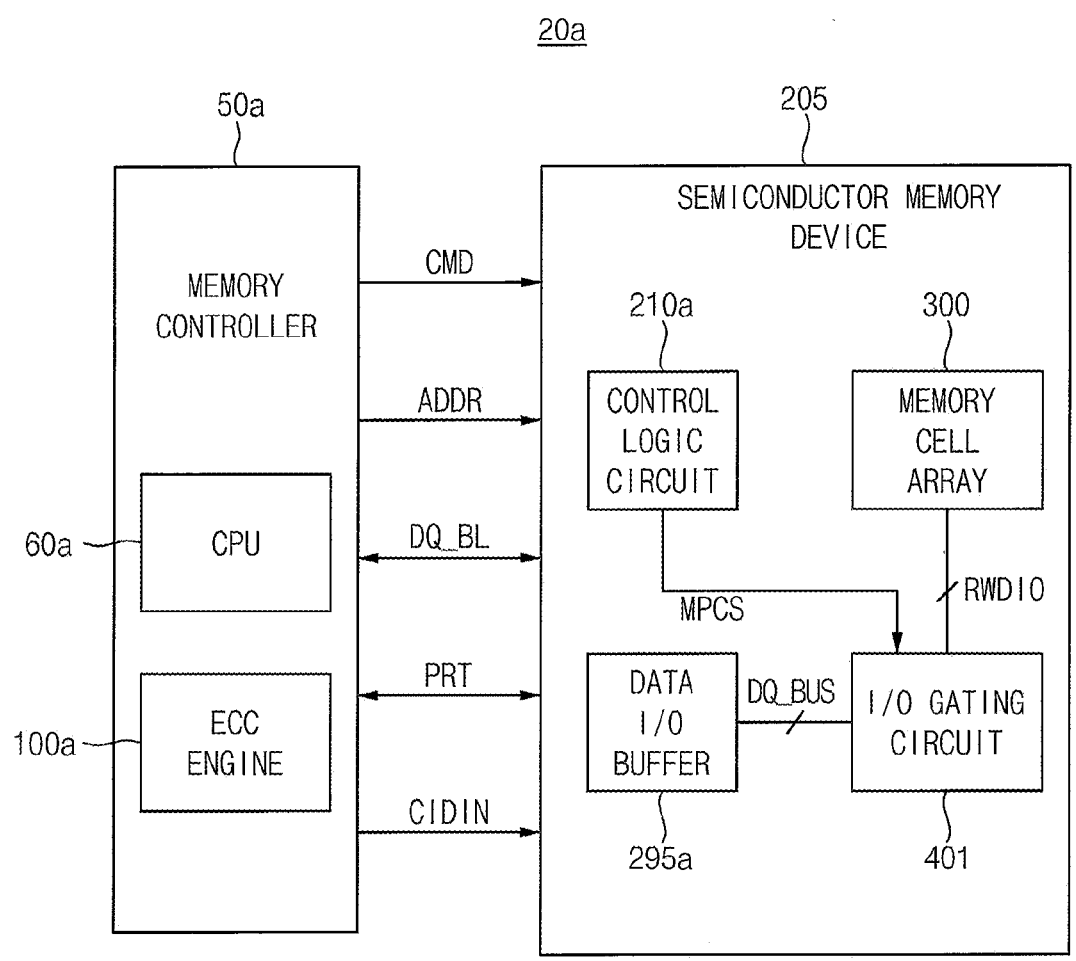

FIG. 28 is a block diagram illustrating a memory system according to example implementations.

Figure 29:
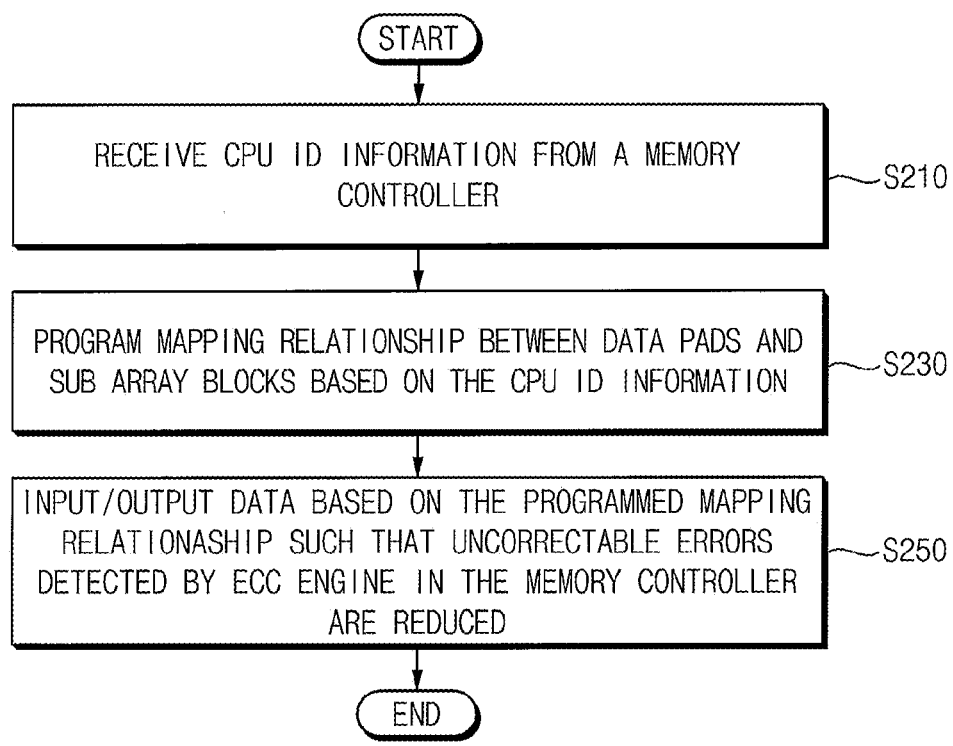

FIG. 29 is a flow chart illustrating a method of operating a semiconductor memory device according to example implementations.

Figure 30:
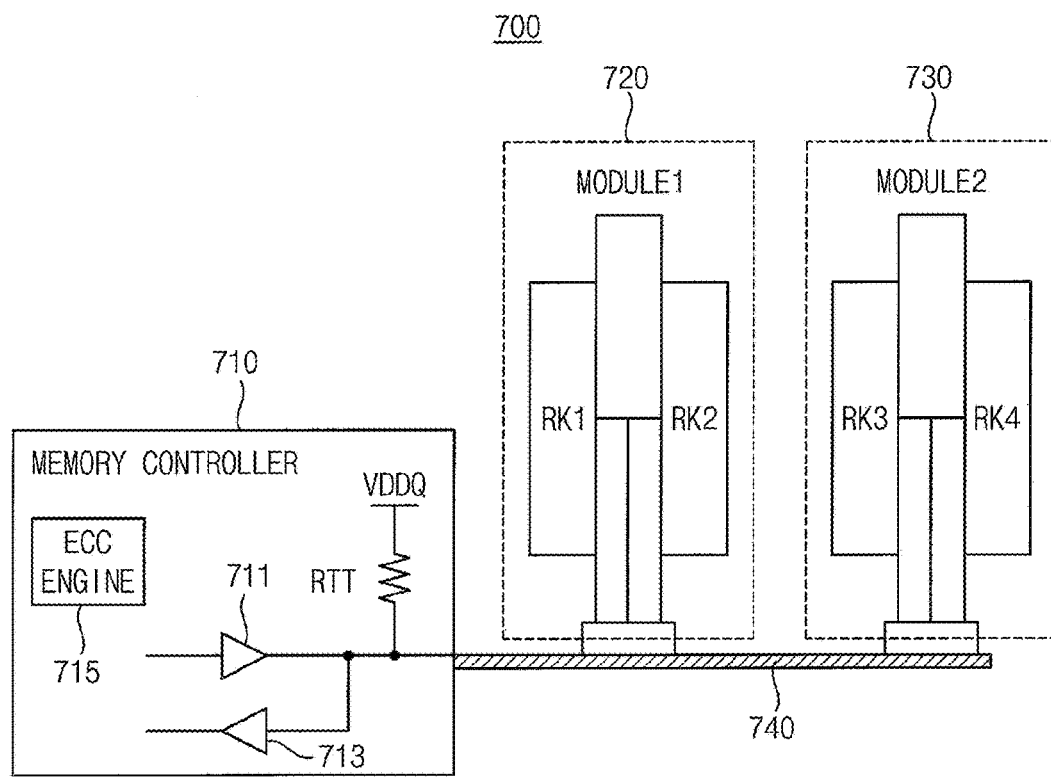

FIG. 30 is a block diagram illustrating a memory system having quad-rank memory modules according to example implementations.

Figure 31:
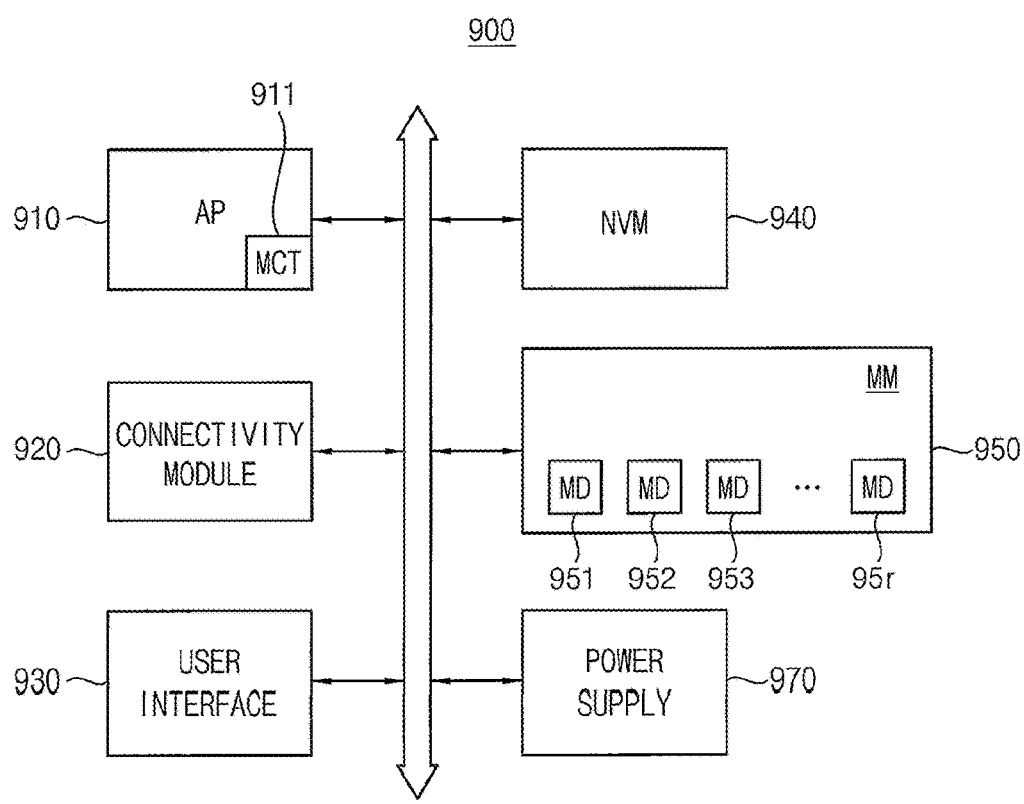

FIG. 31 is a block diagram illustrating a mobile system including a memory module according to example implementations.

DETAILED DESCRIPTION

In some cases, different memory controller central processing units (CPUs) are capable of correcting different types of data errors. A data error that is correctable for a first CPU type may be uncorrectable for a second CPU type, and vice-versa, in some cases based on different error correction engines coupled to or included in the CPUs, or based on another cause. Some implementations according to this disclosure include reconfigurable couplings between the memory controller and units of a memory. The couplings can be reconfigured to adapt to the CPU, such that uncorrectable errors may be decreased.

Example implementations of the present disclosure will be described more fully hereinafter with reference to the accompanying drawings. Like reference numerals may refer to like elements throughout the accompanying drawings.

FIG. 1 is a block diagram illustrating a memory system according to example implementations.

Referring to FIG. 1, a memory system 20 may include a memory controller 50 and a memory module 190. The memory module 190 includes a plurality of semiconductor memory devices 200a~200k, 200ta and 200tb. The plurality of semiconductor memory devices 200a~200k, 200ta and 200tb includes a plurality of data memories (chips) 200a~200k, a first error correction code (ECC) memory (e.g., a chip) 200ta and a second ECC memory (e.g., a chip) 200tb. The plurality of semiconductor memory devices 200a~200k, 200ta and 200tb may be referred to as a plurality of memory chips. In some implementations, the plurality of semiconductor memory devices 200a~200k, 200ta and 200tb are at least partially integrated with one another, e.g., need not each be a separate chip.

The memory controller 50 may control an overall operation of the memory system 20. The memory controller 100 may control an overall data exchange between a host and the plurality of memory chips 200a~200k, 200ta and 200tb. For example, the memory controller 100 may write data in the plurality of memory chips 200a~200k, 200ta and 200tb or read data from the plurality of memory chips 200a~200k, 200ta and 200tc in response to a request from the host. In addition, the memory controller 50 may issue operation commands to the plurality of memory chips 200a~200k, 200ta and 200tb for controlling the plurality of memory chips 200a~200k, 200ta and 200tb.

In example implementations, each of the plurality of memory chips 200a~200k, 200ta and 200tb includes volatile memory cells such as a dynamic random access memory (DRAM).

In example implementations, a number of the data memories 200a~200k may be 8. However, the number of the data memories 200a~200k is not limited thereto.

The memory controller 50 transmits an address ADDR and a command CMD to the memory module 180 and may exchange a message MSG including a codeword from the memory module 180.

The memory controller 50 may include a central processing unit (CPU) 60 and an ECC engine 100. The memory controller 50 may transmit identifier information CIDIN to the memory module 180 and may receive device information DI from the memory module 180. The identifier information CIDIN may include information on (i.e., about) one or more parameters of the CPU 60, such as a type of the CPU 60, a manufacturer of the CPU 60, a model of the CPU 60, a protocol of the CPU 60, and/or an I/O arrangement of the CPU 60, to provide several non-limiting examples. The device information DI may include information such as a module form, a module configuration, a storage capacity, a module type, an execution environment, and/or the like of the memory module 180.

The ECC engine 100 may obtain and/or generate a codeword including a plurality of data bits of a user data set to be stored in the plurality of memory chips 200a~200k, 200ta and 200tb and may transmit the codeword to the memory module 180 in a write operation.

The memory module 180 may further include a serial presence detect (SPD) chip 190 that stores the device information DI. The device information DI may be stored in the SPD chip 190 when the memory module 180 is packaged. The SPD chip 190, in some implementations, is integrated with another component of the memory module 180, e.g., need not be a separate chip.

Figure 2:
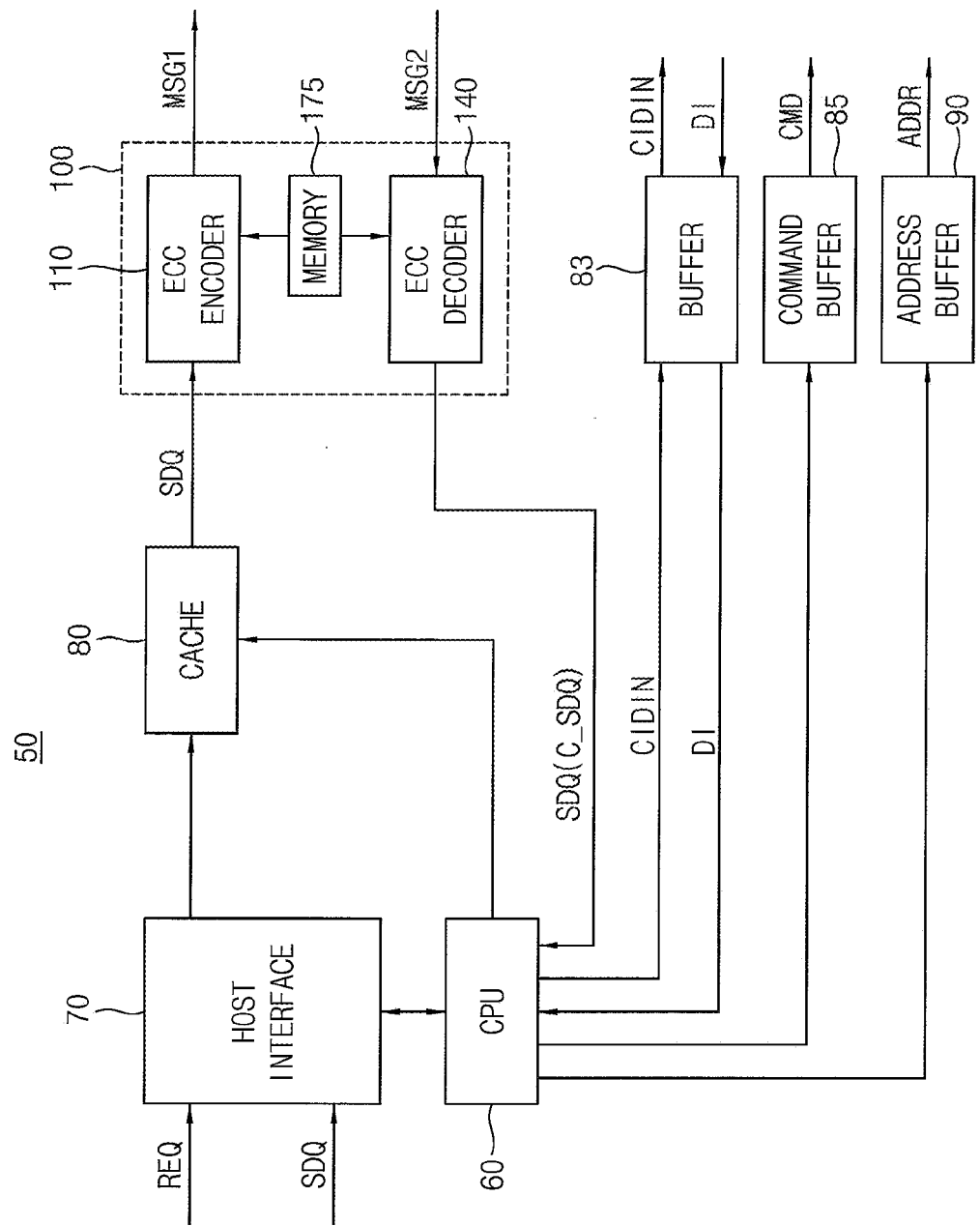
FIG. 2 is block diagram illustrating the memory controller in the memory system of FIG. 1 according to example implementations.

FIG. 2 is block diagram illustrating the memory controller in the memory system of FIG. 1 according to example implementations.

Referring to FIG. 2, the memory controller 50 may include the CPU 60, a host interface 70, a cache 80, the ECC engine 100, a buffer 83, a command buffer 85 and an address buffer 90. The ECC engine 100 may include an ECC encoder 110, an ECC decoder 140 and a memory 175.

The host interface 70 may receive a request REQ and a user data set SDQ from a host, and may provide the user data set SDQ to the cache 80. The cache 80 provides the user data set SDQ to the ECC engine 100. The cache 80 may provide the user data set SDQ to the ECC engine 100 by half of cache line or another increment.

The CPU 60 may receive the device information DI from the buffer 83, and may provide the identifier information CIDIN to the buffer 83.

The ECC encoder 110 may perform an encoding on the user data set SDQ to generate a first message MSG1 including a first codeword and a second codeword.

The ECC decoder 140 may perform an ECC decoding on a second message MSG2 including the first codeword and the second codeword to detect and/or correct errors in the message MSG2 and provides the CPU 60 with the user data set SDQ or a corrected user data set C_SDQ.

The memory 175 is connected to the ECC encoder 110 and the ECC decoder 140, includes an ECC and provides the ECC encoder 110 and the ECC decoder 140 with the ECC.

The CPU 60 may receive the user data set SDQ or the corrected user data set C_SDQ and may control the ECC engine 100, the command buffer 85 and the address buffer 90. The command buffer 85 may store the command CMD corresponding to the request REQ and may transmit the command CMD to the memory module 180 under control of the CPU 60. The address buffer 90 may store the address ADDR and may transmit the address ADDR to the memory module 180 under control of the CPU 60.

The buffer 83 may receive the device information DI from the memory module 180 during a power-up sequence of the memory module 180 and may provide the device information DI to the CPU 60.

Figure 3:
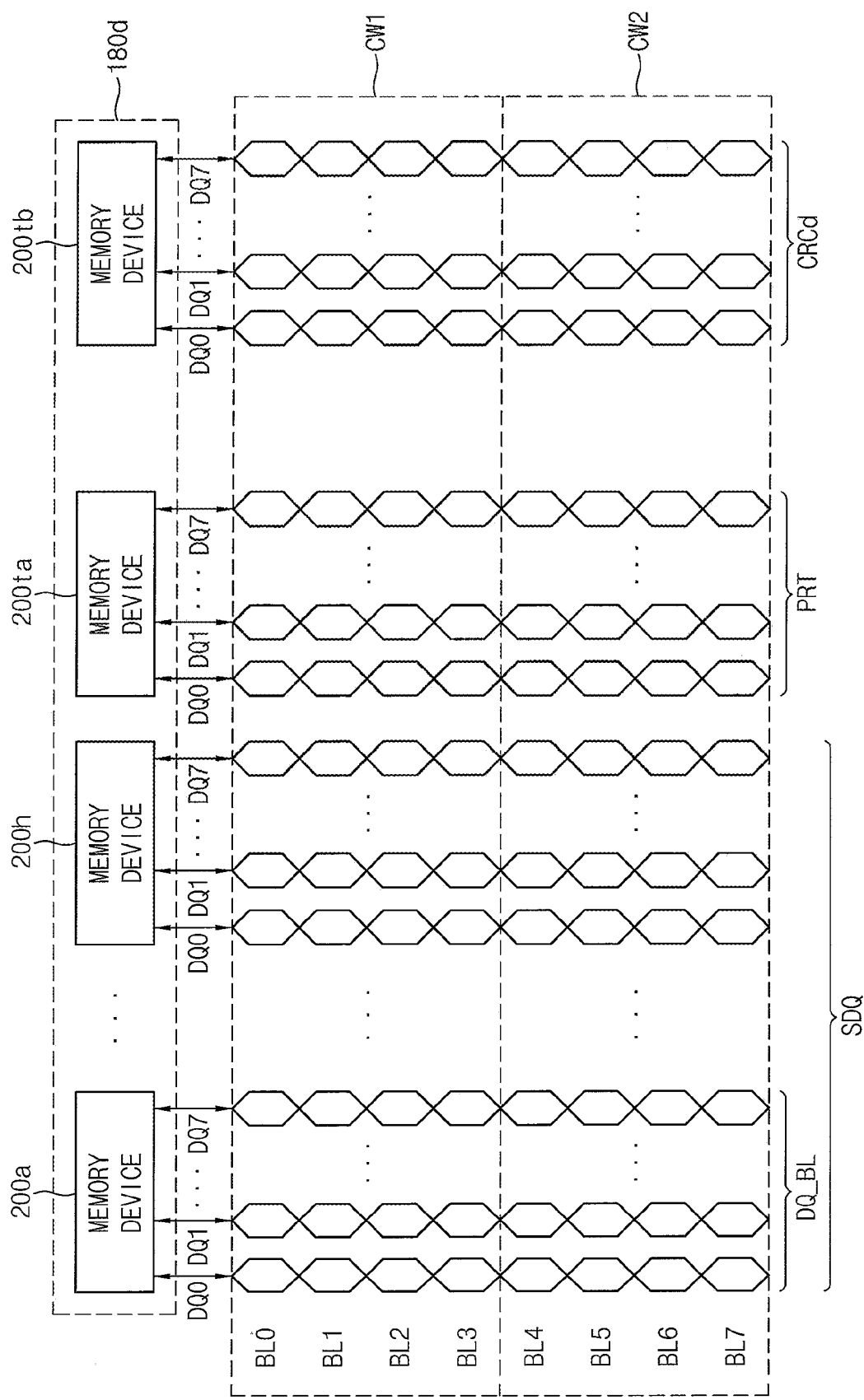
FIG. 3 is a diagram illustrating a burst operation of the memory system of FIG. 1 according to example implementations.

FIG. 3 is a diagram illustrating a burst operation of the memory system of FIG. 1 according to example implementations.

Referring to FIG. 3, the memory module 180 may include one memory rank, and one memory rank may include a plurality of x8 memory chips 200a~200k, 200ta and 200tb. Although described in the context of x8 memory, implementations according to this disclosure are also applicable to other memory types, such as x4 and x16 memories.

The memory module 180 may include the memory chip 200ta that stores a parity data and the memory chip 200tb that stores cyclic redundancy check (CRC) data. For example, when the memory module 180 is an x8 DIMM having a total bus width of 80 bits, because the total number of memory chips of the memory module 180 is 10, the memory module 180 may include 8×8 data chips 200a~200k, a parity chip 200ta and a CRC chip 200tb.

The data bus width of each of x8 memory chips 200a~200k, 200ta and 200tb is 8 bits. When each of the memory chips 200a~200k, 200ta and 200tb outputs data, 8-bit data may be output simultaneously through eight DQ (data input/output) pads DQ0~DQ7. The 8-bit data may be simultaneously output from the memory chips 200a~200h, 200ta and 200tb, respectively.

The memory chips 200a~200k, 200ta and 200tb may perform a burst operation. A burst operation may refer to an operation for reading or writing a large amount of data by sequentially decreasing or increasing an address from an initial address received from the memory controller 50. The basic unit for performing a burst operation may be referred to as a burst length (BL). The BL may be 8, as shown in FIG. 3, or another value.

The DQ pads DQ0~DQ7 of each of the data chips 200a~200k, 200ta and 200tb may input and output eight pieces of data BL0~BL7 (or another number of pieces of data) as a basic unit of a burst operation. For example, in the case of an x8 DIMM, data input and output per unit task during a burst operation may be 8 (BL)×8 (data bus width)× 10 (number of chips)=640 bits.

640 bits may fill one cache line of the memory controller 50. A unit of memory for which error correction is performed may be defined as one codeword or as corresponding to one codeword. For example, in the error correction mode of x8 DIMM, each error correction may be performed for half of a cache line. Accordingly, the basic unit of a burst operation for filling one cache line may include, or may use, two codewords. For example, in the case of one cache line corresponding to 640 bits, the ECC engine 100 of the memory controller 50 may implement an error correction algorithm with respect to two 320-bit units of data, of each of a first codeword CW1 and a second codeword CW2.

In FIG. 3, the data input/output to/from the data memory 200a corresponds to a user data DQ_BL, overall data input/output to/from the data memories 200a~200k corresponds to the user data set SDQ, the data input/output to/from the parity chip 200ta corresponds to a parity data PRT and the data input/output to/from the CRC chip 200tb corresponds to a CRC data CRCd.

Figure 4:
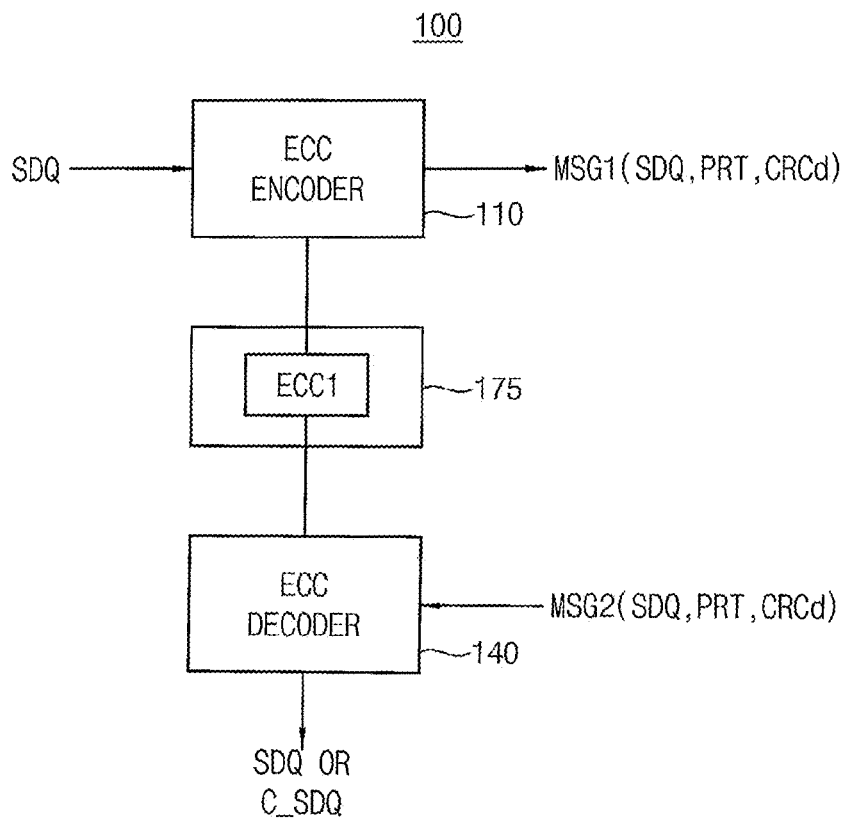
FIG. 4 is a block diagram illustrating an example of the ECC engine in FIG. 2 according to example implementations.

FIG. 4 is a block diagram illustrating an example of the ECC engine in FIG. 2 according to example implementations.

Referring to FIG. 4, the ECC engine 100 may include the ECC encoder 110, the ECC decoder 140 and the memory 175.

The memory 175 may be connected to the ECC encoder 110 and the ECC decoder 140 and may store an ECC ECC1.

The ECC encoder 110 may perform an encoding (error correction algorithm encoding) on the user data set SDQ by using the ECC ECC1 to generate a CRC data CRCd and a parity data PRT and may provide the first message MSG1 including the user data set SQD, the CRC data CRCd and the parity data PRT.

The ECC decoder 140 may perform an error correction algorithm decoding on the second message MSG2 including the user data set SQD, the CRC data CRCd and the parity data PRT by using the ECC ECC1 to output the user data set SDQ or to output the corrected user data set C_SDQ by correcting at least one error bit in the user data set SDQ.

Figure 5:
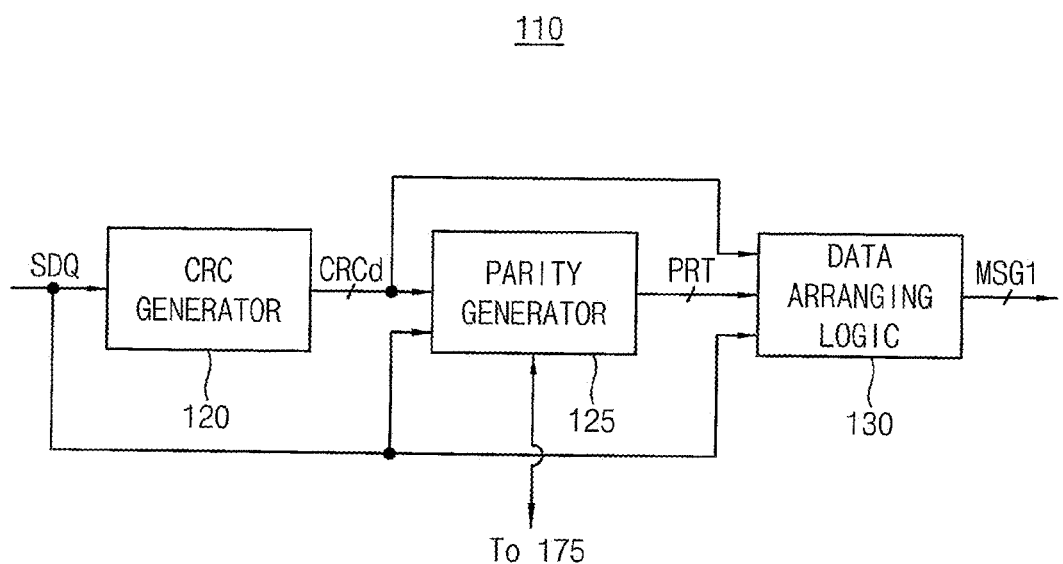
FIG. 5 is an example of the ECC encoder in the ECC engine of FIG. 4 according to example implementations.

FIG. 5 is an example of the ECC encoder in the ECC engine of FIG. 4 according to example implementations.

Referring to FIG. 5, the ECC encoder 110 may include CRC generator 120, a parity generator 125 and a data arranging logic 130.

The CRC generator 120 may generate the CRC data CRCd based on the user data set SDQ and may provide the CRC data CRCd to the parity generator 125. The parity generator 125 is connected to the memory 175 and may generate the parity data PRT by performing ECC encoding on the user data set SDQ and the CRC data CRCd by using the ECC ECC1.

The data arranging logic 130 may arrange the user data set SDQ, the CRC data CRCd and the parity data PRT to generate the first message MSG and may provide the first message MSG1 to the memory module 180.

Figure 6:
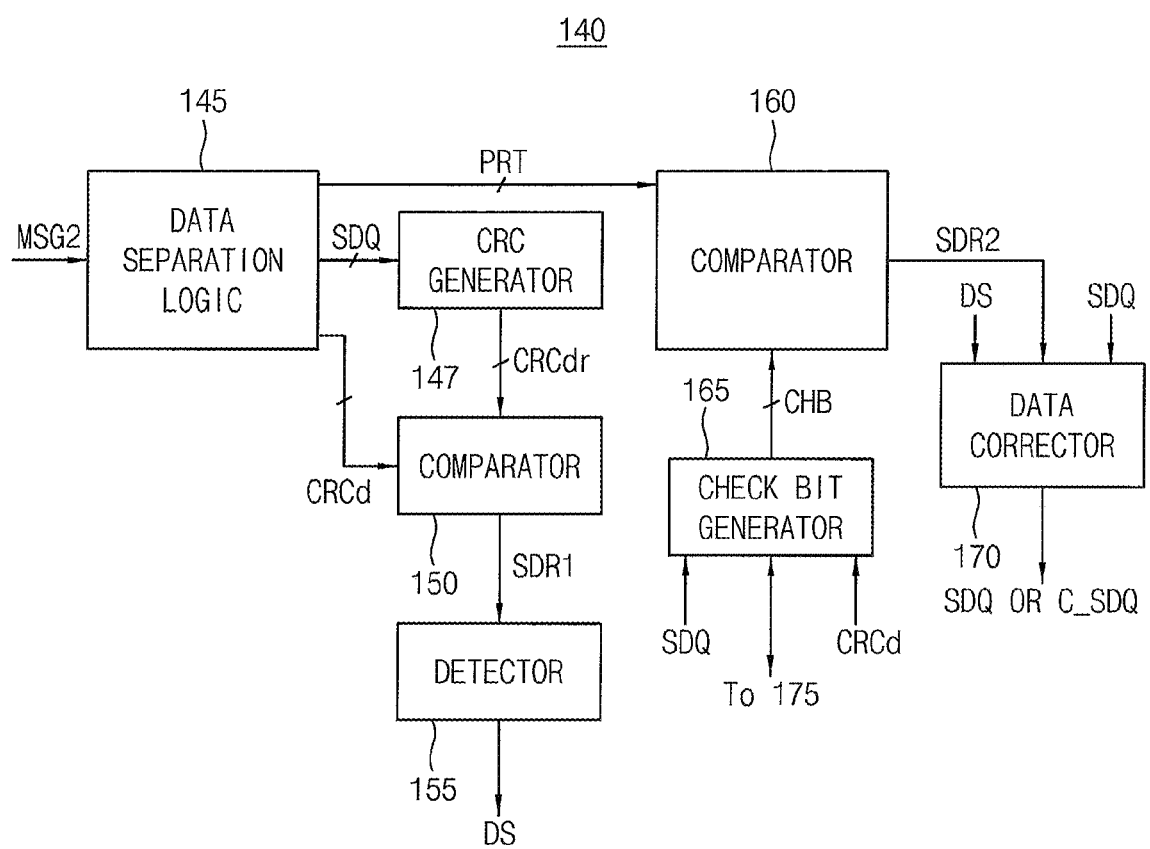
FIG. 6 is an example of the ECC decoder in the ECC engine of FIG. 4 according to example implementations.

FIG. 6 is an example of the ECC decoder in the ECC engine of FIG. 4 according to example implementations.

Referring to FIG. 6, the ECC decoder 140 may include a data separation logic 145, a CRC generator 147, a comparator 150, a detector 155, a comparator 160, a check bit generator 165 and a data corrector 170.

The data separation logic 145 may receive the second message MSG2 from the memory module 180, may separate the second message MSG2 into the user data set SDQ, the CRC data CRCd and the parity data PRT, may provide the CRC data CRCd to the comparator 150, may provide the user data set SDQ to the CRC generator 147 and the check bit generator 165, and may provide the parity data PRT to the comparator 160.

The CRC generator 147 may generate a reference CRC data CRCdr based on the user data set SDQ to provide the reference CRC data CRCdr to the comparator 150. The comparator 150 may compare the CRC data CRCd and the reference CRC data CRCdr bit-wisely to generate a first syndrome SDR1.

The detector 155 may generate a detection signal DS indicating whether the user data set includes at least one error bit based on the first syndrome SDR1.

The check bit generator 180 is connected to the memory 175 and may generate check bits CHB by performing ECC decoding on the user data set SDQ and the CRC data CRCd by using the ECC ECC1. The comparator 165 may compare the parity data PRT and the check bits CHB bit-wisely to generate a second syndrome SDR2 indicating whether the error bit occurs in the user data set SDQ and a position of the error bit.

The data corrector 170 may receive the user data set SDQ and may correct the at least one error bit in the user data set SDQ based on the second syndrome SDR2 and the detection signal DS by inverting error bit of the data set based on the second syndrome SDR2 and the detection signal DS. The data corrector 170 may output the user data set SDQ or the corrected user data set C_SDQ.

Figure 7:
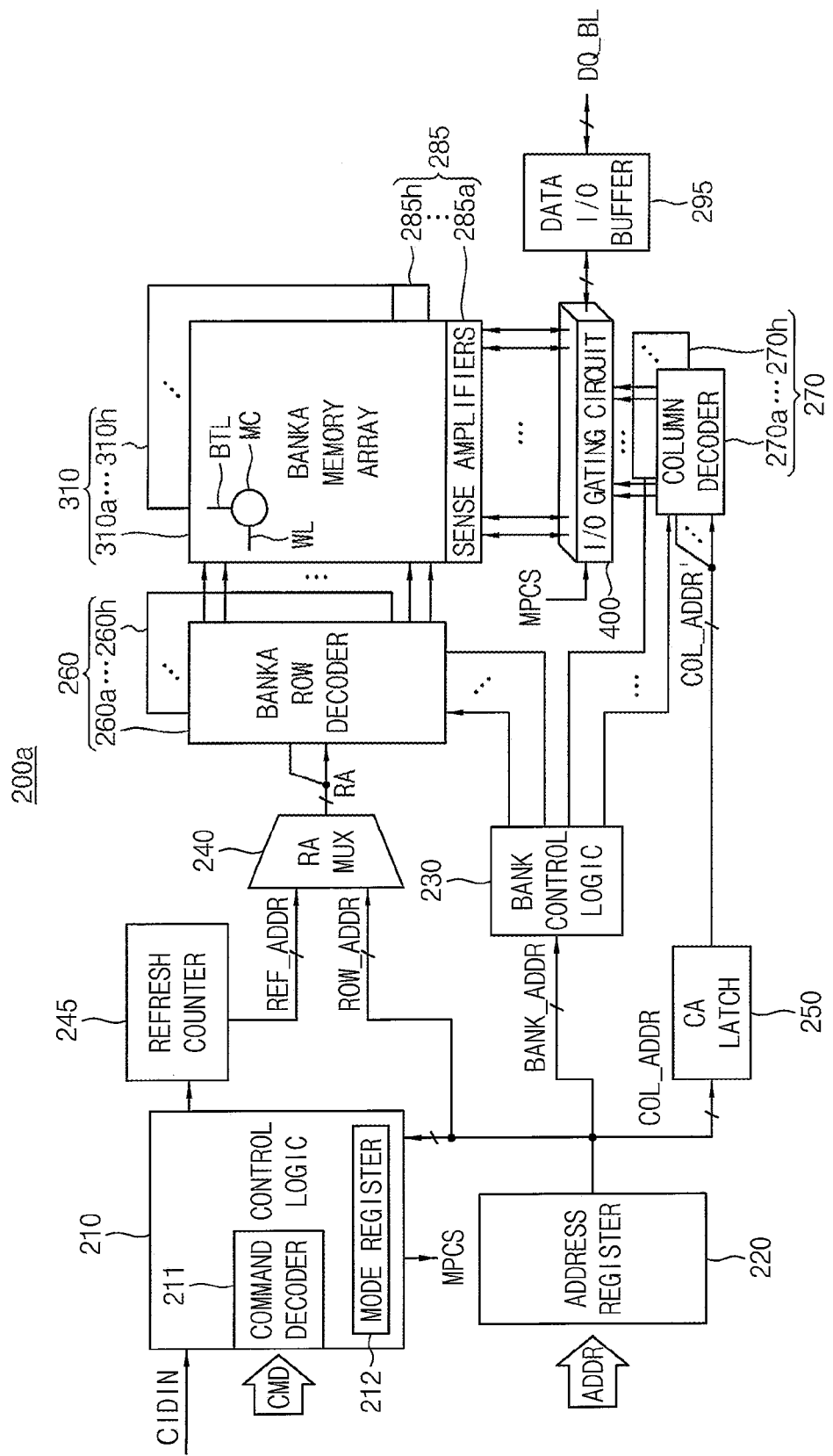
FIG. 7 is a block diagram illustrating one of the data memories in the memory module in FIG. 1 according to example implementations.

FIG. 7 is a block diagram illustrating one of the data memories in the memory module in FIG. 1 according to example implementations.

Referring to FIG. 7, the data memory 200a may include a control logic circuit 210, an address register 220, a bank control logic circuit 230, a row address multiplexer 240, a column address latch 250, a row decoder 260, a column decoder 270, a memory cell array 310, a sense amplifier unit 285, an input/output (I/O) gating circuit 400, a data input/output (I/O) buffer 295 and a refresh counter 245.

The memory cell array 310 may include first through eighth bank arrays 310a~310h.

The row decoder 260 may include first through eighth row decoders 260a~260h coupled to the first through eighth bank arrays 310a~310h, respectively, the column decoder 270 may include first through eighth column decoders 270a~270h coupled to the first through eighth bank arrays 310a~310h, respectively, and the sense amplifier unit 285 may include first through eighth sense amplifiers 285a~285h coupled to the first through eighth bank arrays 310a~310h, respectively. Other numbers of these and other components of the data memory are also within the scope of this disclosure.

The first through eighth bank arrays 310a~310h, the first through eighth row decoders 260a~260h, the first through eighth column decoders 270a~270h, and the first through eighth sense amplifiers 285a~285h may form first through eighth banks. Each of the first through eighth bank arrays 310a~310h may include a plurality of word-lines WL, a plurality of bit-lines BTL, and a plurality of memory cells MC formed at intersections of the word-lines WL and the bit-lines BTL.

Although the data memory 200a is illustrated in FIG. 7 as including eight banks, the data memory 200a may include any number of banks.

The address register 220 may receive the address ADDR including a bank address BANK_ADDR, a row address ROW_ADDR, and a column address COL_ADDR from the memory controller 50. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth row decoders 260a~260h corresponding to the bank address BANK_ADDR may be activated in response to the bank control signals, and one of the first through eighth column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth row decoders 260a~260h.

The activated one of the first through eighth row decoders 260a~260h may decode the row address RA that is output from the row address multiplexer 240, and may activate a word-line WL corresponding to the row address RA. For example, the activated row decoder may generate a word-line driving voltage and may apply the word-line driving voltage to the word-line WL corresponding to the row address RA.

The column address latch 250 may receive the column address COL_ADDR from the address register 220, and may temporarily store the received column address COL_ADDR. In example implementations of the present disclosure, in a burst mode, the column address latch 250 may generate column addresses COL_ADDR' that increment from the received column address COL_ADDR. The column address latch 250 may apply the temporarily stored or generated column address COL_ADDR' to the first through eighth column decoders 270a~270h.

The activated one of the first through eighth column decoders 270a~270h may decode the column address COL_ADDR that is output from the column address latch 250, and may control the I/O gating circuit 400 to output data corresponding to the column address COL_ADDR.

The I/O gating circuit 400 may include circuitry for gating input/output data. The I/O gating circuit 400 may further include read data latches for storing data that is output from the first through eighth bank arrays 310a~310h, and write control devices for writing data to the first through eighth bank arrays 310a~310h.

The I/O gating circuit 400 may be connected to the data I/O buffer 295 through a plurality of data buses and may be connected to the sense amplifier unit 285 through a plurality of data I/O lines. The I/O gating circuit 400 may program mapping relationship between a plurality of sub array blocks in the memory cell array 310 and a plurality of I/O pads through which the user data is input/output, based on a mapping control signal MPCS from the control logic circuit 210, such that uncorrectable errors that are detected by the ECC engine 100 in the memory controller 50 are reduced.

Data to be read from one of the first through eighth bank arrays 310a~310h may be sensed by a sense amplifier coupled to the one bank array from which the data is to be read, and may be stored in the read data latches.

The data stored in the read data latches may be provided to the memory controller 50 via the data I/O buffer 295. Data set DQ_BL to be written in one of the first through eighth bank arrays 310a~310h may be provided to the data I/O buffer 295 from the memory controller 50. The data I/O buffer 295 may provide the data set DQ_BL to the I/O gating circuit 400.

The control logic circuit 210 may control operations of the data memory 200a. For example, the control logic circuit 210 may generate control signals for the data memory 200a to perform the write operation or the read operation. The control logic circuit 210 may include a command decoder 211 that decodes the command CMD received from the memory controller 50 and a mode register 212 that sets an operation mode of the data memory 200a. In example implementations, the control logic circuit 210 may generate the mapping control signal MPCS based on the identifier information CIDIN from the memory controller 50 and may provide the mapping control signal MPCS to the I/O gating circuit 400.

The identifier information CIDIN is set in the mode register 212 and the control logic circuit 210 may generate the mapping control signal MPCS according to the set information for programming mapping relationship between a plurality of sub array blocks in the memory cell array 310 and a plurality of I/O pads through which the user data is input/output such that uncorrectable errors that are detected by the ECC engine 100 in the memory controller 50 are reduced.

The identifier information CIDIN may be set in the mode register 212 to have different codes according to a type of the CPU 60, a manufacturer of the CPU 60, and/or other information characterizing the CPU 60. The identifier information CIDIN may be programmed in an anti-fuse to have different codes according to a type of the CPU 60, a manufacturer of the CPU 60, and/or other information characterizing the CPU 60.

Each of the ECC memories 200ta and 200tb may have substantially the same configuration as the data memory 200a.

Figure 8:
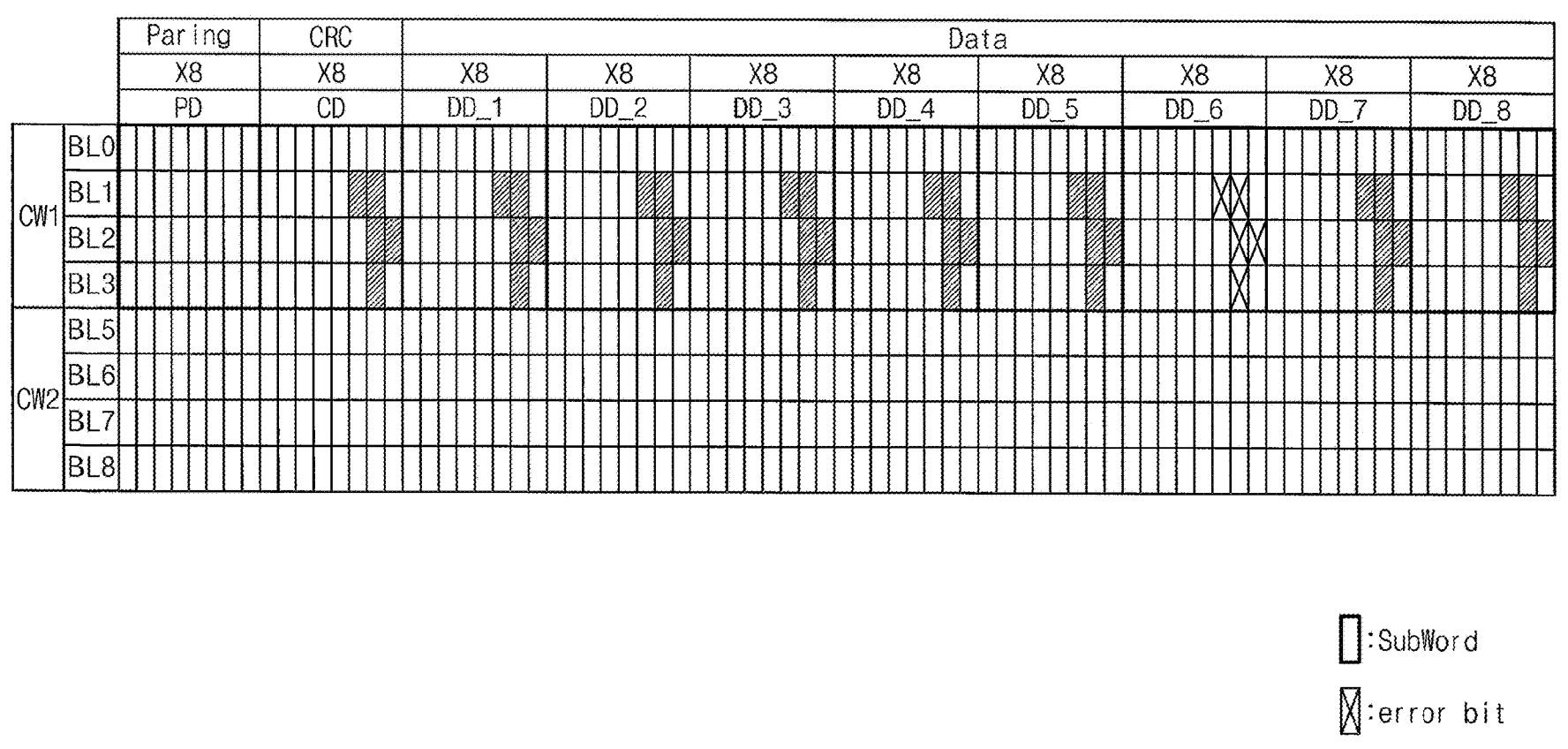

FIG. 8 is a diagram illustrating a data structure in which an error correction algorithm is performed according to example implementations.

Referring to FIGS. 3 and 8, the memory module 180 may include one memory rank and may be x8 DIMM including 10 x8 memories. One of the 10 x8 memories may be parity memory (a first ECC memory) PD for storing parity data, and one of the 10 x8 memories may be CRC memory (a second ECC memory) CD for storing CRC data.

The memory module 180 may include 8 x4 data memories DD_1 through DD_8 for storing data. FIG. 8 shows data output from the memory module 180 configured as x8 ECC DIMM per unit burst operation.

The BL may be 8. A total of 640 bits of data may fill one cache line of the memory controller 50 and constitute two codewords CW1 and CW1. The memory controller 50 may perform an error correction algorithm based on a codeword.

In FIG. 8, subwords and an error bit are illustrated.

Figure 9:
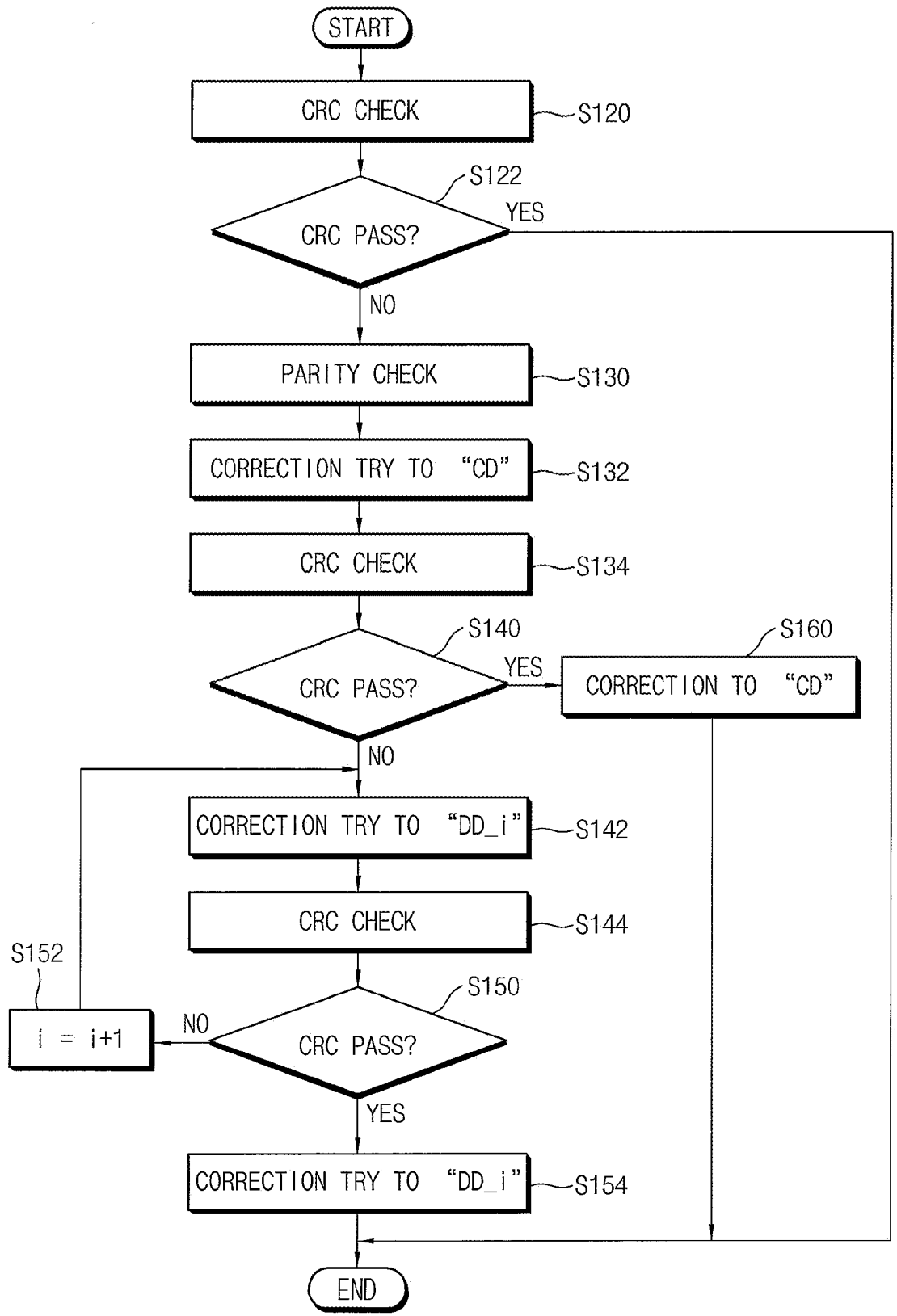
FIG. 9 is a flowchart illustrating a method of performing an error correction algorithm according to example implementations.

FIG. 9 is a flowchart illustrating a method of performing an error correction algorithm according to example implementations.

FIG. 9 may be described with reference to FIG. 8. A method of detecting and correcting an error bit will be described under an assumption that an error has occurred in a sixth data memory DD_6 belonging to the first code word CW1 of FIG. 8.

CRC check may be initially performed with respect to a codeword unit (S120). When CRC check is performed with respect to the entire first codeword CW1, pass or failure of the CRC check may be determined (S122). When the CRC check passes, an error correction algorithm may be terminated because there is no error in the first codeword CW1.

When the CRC check fails (S122), there is an error in the first codeword CW1, and thus a next step may be performed to locate an error bit in which the error exists.

Therefore, when The CRC check fails, a parity check may be performed (S130). Referring to FIG. 8, for convenience of description, 32-bit data grouped by the data bus width of 8 bits in the first codeword CW1 according to a data bus width may be referred to as a sub-word.

The first codeword CW1 may include a total of 10 sub-words. One parity check may be performed on data corresponding to a same location from among data included in one of the 10 sub-words, and a total of 8 parity checks may be performed. Although the parity check may be an even parity check, the present disclosure is not limited thereto, and the parity check may also be an odd parity check. By performing parity check, the location of an error bit in sub-words may be determined. Referring to FIG. 8, there are errors at bits (hatched portions) existing at locations of (2, 2), (2, 3), (3, 3), (3, 4), and (4, 3) within one sub-word. After locating the error bit in the sub-word, a next operation may be performed to find out a device with the error bit.

First, correction may be attempted with respect to a sub-word corresponding to the CRC memory CD (S132). Next, a CRC check may be performed (S134). Pass or failure of the CRC check may be determined (S140). When the CRC check passes, it may be determined that the CRC memory CD is a device with an error and error correction may be performed on the CRC memory CD (S160). When the CRC check fails, it may be determined that the CRC memory CD is not a device with an error, and the process may proceed to a next operation.

Next, correction may be attempted with respect to a sub-word corresponding to a DD_1 data memory (S142). Next, CRC check may be performed (S144). Then, pass and failure of the CRC check may be determined (S150). When the CRC check passes, it may be determined that the DD_1 data memory is a device with an error and error correction may be performed on the DD_1 data memory (S154).

When the CRC check fails, it may be determined that the DD_1 data memory is not a device with an error, and the process may proceed to a next operation. Next, since it is desired to attempt correction with respect to a sub-word corresponding to a DD_2 data memory, 1 may be added to a sequence factor i (S152). Next, correction may be attempted with respect to a sub-word corresponding to the DD_2 data memory (S142), and operations thereafter may be repeated in the same manner until the CRC check passes.

As a result, it may be determined that there is an error in a device that passed CRC, and a final error correction may be performed with respect to the device (S154). Accordingly, an error correction algorithm that detects and corrects errors existing in a device may be completed. Of course, other types of error correction algorithms may also be performed in the error correction mode. Thus, error correction algorithms are not limited to the algorithm described in FIG. 9.

Figure 10:
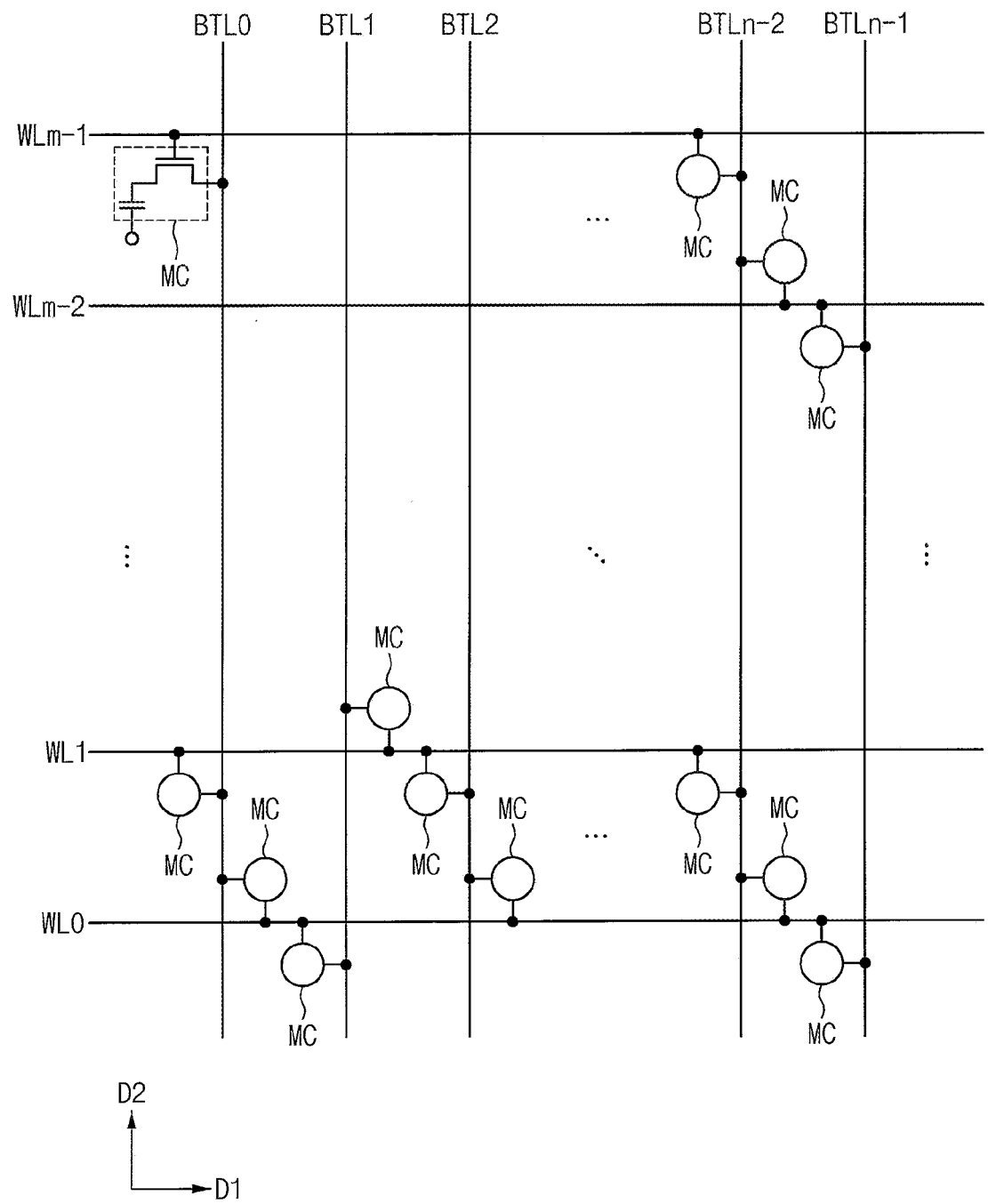
FIG. 10 illustrates an example of the first bank array in the data memory of FIG. 7.

FIG. 10 illustrates an example of the first bank array in the data memory of FIG. 7.

Referring to FIG. 10, the first bank array 310a may include a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells MCs may include a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction D1 and each of the bit-lines BTL1~BTLn−1 extends in a second direction D2 crossing the first direction D1.

The word-lines WL0~WLm−1 coupled to the plurality of memory cells MCs may be referred to as rows of the first bank array 310a and the bit-lines BTL0~BTLn−1 coupled to the plurality of memory cells MCs may be referred to as columns of the first bank array 310a.

FIG. 11 illustrates a portion of the data memory of FIG. 7 according to some example implementations.

In FIG. 11, the first bank array 310a, the first sense amplifier 285a, the I/O gating circuit 400 and the data I/O buffer 295 are illustrated.

Referring to FIG. 11, in the first bank array 310a, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier 285a may be disposed in the first direction D1 with respect to the first bank array 310a and the first sense amplifier 285a may include I/O sense amplifiers IOSAs 286a and drivers DRVs 287a corresponding to the sub array blocks SCB in the first direction D1. Each of the I/O sense amplifiers 286a and the drivers 287a may be connected to a corresponding column through global I/O lines GIO and GIOB.

The first sense amplifier 285a may be connected to the I/O gating circuit 400 through a plurality of data I/O lines RWDIO and the I/O gating circuit 400 may be connected to the data I/O buffer 295 through a plurality data buses DQ_BUS.

A portion 390 in the first bank array 310a will be described with reference to FIG. 12 below.

Figure 12:
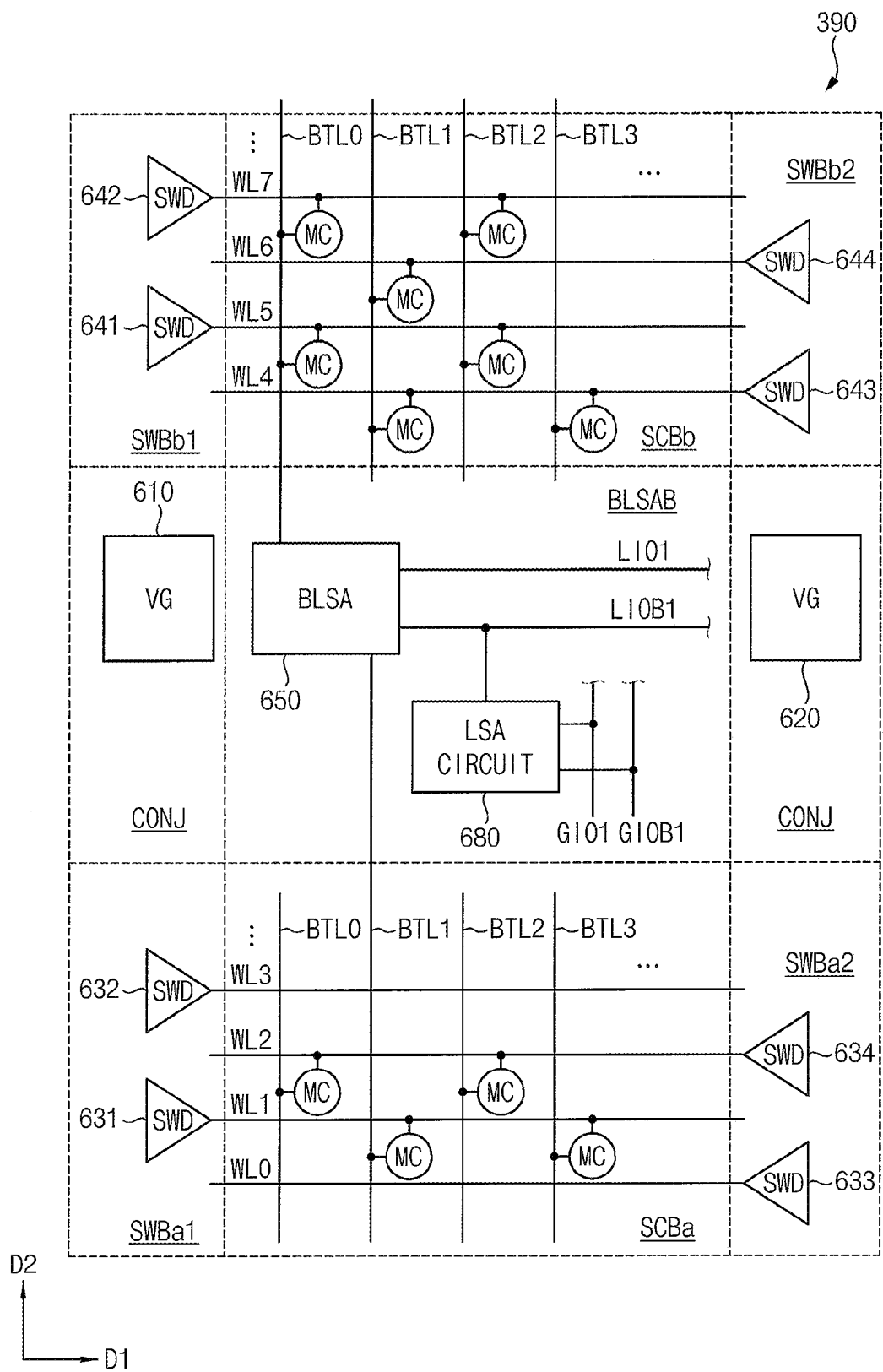
FIG. 12 illustrates a portion of the first bank array in FIG. 11 according to example implementations.

FIG. 12 illustrates a portion of the first bank array in FIG. 11 according to example implementations.

Referring to FIGS. 11 and 12, in the portion 390 of the first bank array 310a, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the first direction D1 and a plurality of bit-line BTL0~BTL3 extending in the second direction D2. The sub-array block SCBa may include a plurality of memory cells MCs disposed at intersections of the word-lines WL0~WL3 and the bit-line BTL0~BTL3. The sub-array block SCBb may include a plurality of word-lines WL4~WL7 extending in the first direction D1 and the plurality of bit-line BTL0~BTL3 extending in the second direction D2. The sub-array block SCBb may include a plurality of memory cells MCs disposed at intersections of the word-lines WL4~WL7 and the bit-line BTL0~BTL3.

With reference to FIG. 12, the sub word-line driver regions SWBa1 and SWBa2 may include a plurality of sub word-line drivers 631, 632, 633 and 634 that respectively drive the word-lines WL0~WL3. The sub word-line driver regions SWBb1 and SWBb2 may include a plurality of sub word-line drivers 641, 642, 643 and 644 that respectively drive the word-lines WL4~WL7.

The bit-line sense amplifier region BLSAB may include a bit-line sense amplifier BLSA 650 coupled to the bit-line BTL0 in the sub array block SCBb and the bit-line BTL1 in the sub array block SCBa, and a local sense amplifier LSA circuit 680. The bit-line sense amplifier 650 may sense and amplify a voltage difference between the bit-lines BTL0 and BTL1 to provide the amplified voltage difference to a local I/O line pair LIO1 and LIOB1.

The local sense amplifier circuit 680 may control electrical connection between the local I/O line pair LIO1 and LIOB1 and a global I/O line pair GIO1 and GIOB1.

As illustrated in FIG. 12, the conjunction regions CONJ may be disposed adjacent to the bit-line sense amplifier region BLSAB and the sub word-line driver regions SWBa1, SWBb1, SWBa2 and SWBb2. Voltage generators 610 and 620 may be disposed in the conjunction regions CONJ.

Figure 13:
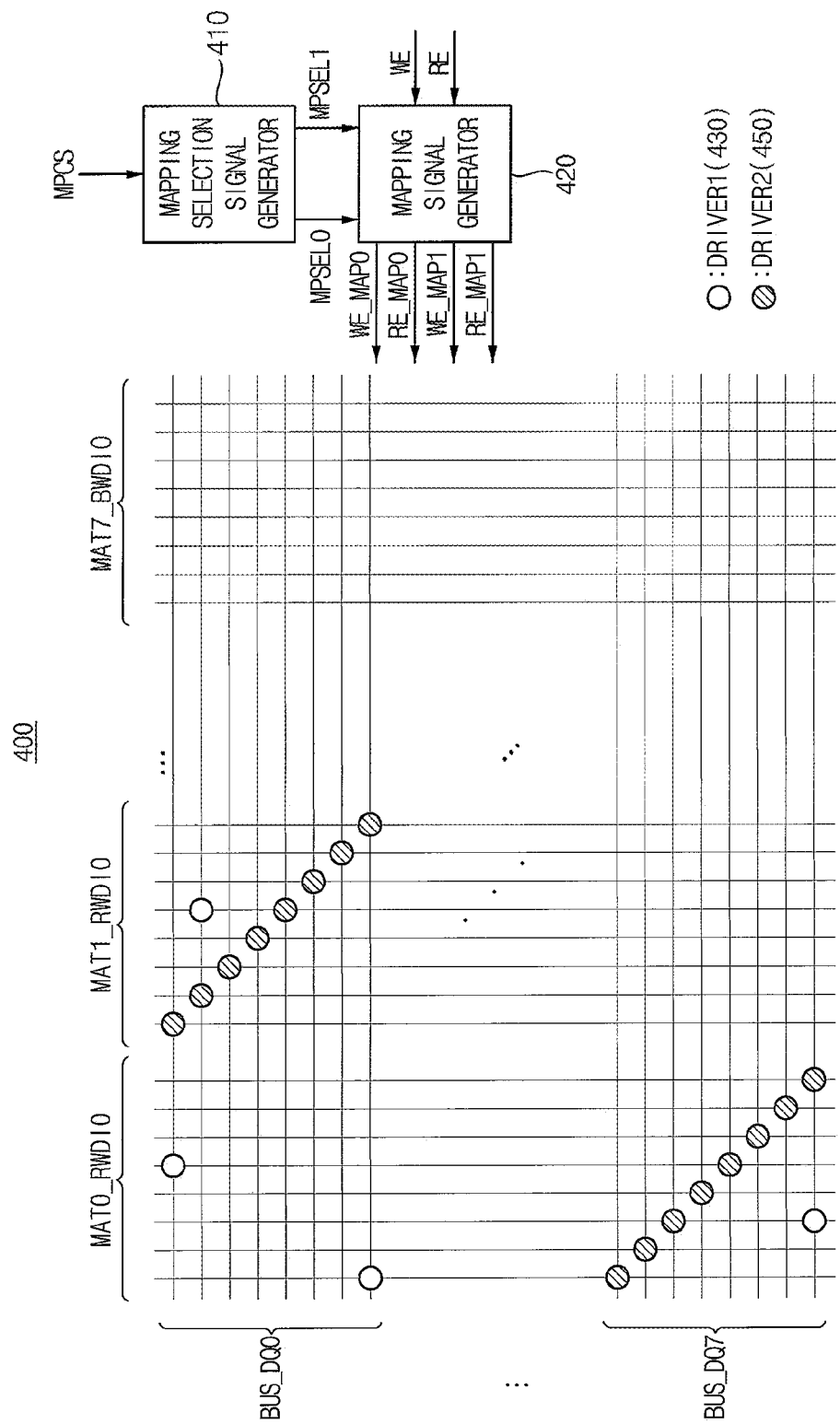
FIG. 13 illustrates an example of the I/O gating circuit in the data memory of FIG. 11 according to example implementations.

FIG. 13 illustrates an example of the I/O gating circuit in the data memory of FIG. 11 according to example implementations.

Referring to FIG. 13, the I/O gating circuit 400 may include a mapping selection signal generator 410, a mapping signal generator 420, a plurality of first drivers DRIVER1 430 and a plurality of second drivers DRIVER2 450.

The mapping selection signal generator 410 may generate a first mapping selection signal MPSEL0 associated with an operation of each of the first drivers 430 and a second mapping selection signal MPSEL1 associated with an operation of each of the second drivers 450, based on the mapping control signal MPCS.

The mapping signal generator 420 may generate a pair of first mapping signal WE_MAP0 and RE_MAP0 and a pair of second mapping signal WE_MPA1 and RE_MAP2 450 based on the first mapping selection signal MPSEL0, the second mapping selection signal MPSEL1, a write enable signal WE and a read enable signal RE, may provide the pair of first mapping signal WE_MAP0 and RE_MAP0 to the first drivers 430 and may provide the second mapping selection signal MPSEL1 to the second drivers 450.

The pair of first mapping signal WE_MAP0 and RE_MAP0 may include a first write mapping signal WE_MAP0 and a first read mapping signal RE_MAP0 and the pair of second mapping signal WE_MAP1 and RE_MAP1 may include a second write mapping signal WE_MAP1 and a second read mapping signal RE_MAP1.

Each of the first drivers 430 may connect a first data I/O line from among a plurality of data I/O lines MAT0_RWDIO, MAT1_RWDIO, . . . , MAT7_RWDIO to a first data bus from among a plurality of data buses BUS_DQ0, BUS_DQ1, . . . , BUS_DQ7 according to a first mapping relationship.

Each of the second drivers 450 may connect the first data I/O line from among the plurality of data I/O lines MAT0_RWDIO, MAT1_RWDIO, . . . , MAT0_RWDIO to a second data bus different from the first data bus, from among the plurality of data buses BUS_DQ0, BUS_DQ1, BUS_DQ7 according to a second mapping relationship.

The plurality of data I/O lines MAT0_RWDIO, MAT1_RWDIO, . . . , MAT0_RWDIO may correspond to first through eighth sub array blocks, respectively, from among the plurality of sub array blocks SCB in the first direction D1 in the first bank array 310a in FIG. 11, and the plurality of data buses BUS_DQ0, BUS_DQ1, . . . , BUS_DQ7 may correspond to data bits input/output during a BL of each of first through eighth BLs in FIG. 3.

Each of the first drivers 430 and each of the second drivers 450 may be activated exclusively from each other in response to the pair of first mapping signals WE_MAP0 and RE_MAP0 and the pair of second mapping signals WE_MAP1 and RE_MAP1. In some implementations, the first drivers 430 are activated based on the mapping signal generator 420 generating and providing the pair of first mapping signals, and the second drivers 450 are activated based on the mapping signal generator 420 generating and providing the pair of second mapping signals. In some implementations, at a given time, the mapping signal generator 420 generates the pair of first mapping signals or the pair of second mapping signals, to activate only the first drivers 430 or only the second drivers 450 at any given time (e.g., exclusively). In some implementations, the first drivers 430 are activated based on the mapping signal generator 420 generating and providing the pairs of first and second mapping signals with a first configuration (e.g., with the pair of first signals high and the pair of second signals low), and the second drivers 450 are activated based on the mapping signal generator 420 generating and providing the pairs of first and second mapping signals with a second configuration (e.g., with the pair of first signals low and the pair of second signals high). Other signal configurations for activation/deactivation of drivers are also within the scope of this disclosure.

Figure 14:
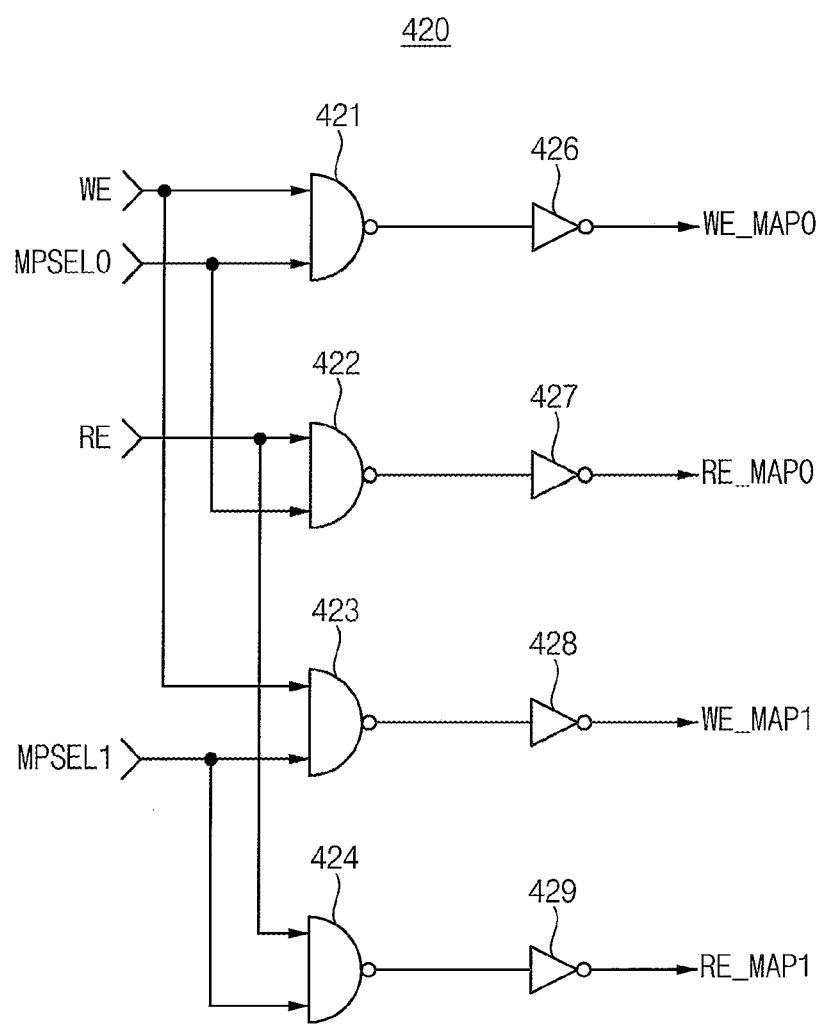
FIG. 14 is a circuit diagram illustrating an example of the mapping signal generator in the I/O gating circuit of FIG. 13 according to example implementations.

FIG. 14 is a circuit diagram illustrating an example of the mapping signal generator in the I/O gating circuit of FIG. 13 according to example implementations.

Referring to FIG. 14, the mapping signal generator 420 may include first through fourth NAND gates 421, 422, 423 and 424 and first through fourth inverters 426, 427, 428 and 429.

The first NAND gate 421 may perform a NAND operation on the write enable signal WE and the first mapping selection signal MPSEL0. The second NAND gate 422 may perform a NAND operation on the read enable signal RE and the first mapping selection signal MPSEL0. The third NAND gate 423 may perform a NAND operation on the write enable signal WE and the second mapping selection signal MPSEL1. The fourth NAND gate 424 may perform a NAND operation on the read enable signal RE and the second mapping selection signal MPSEL1.

The first inverter 426 may output the first write mapping signal WE_MAP0 by inverting an output of the first NAND gate 421. The second inverter 427 may output the first read mapping signal RE_MAP0 by inverting an output of the second NAND gate 422. The third inverter 428 may output the second write mapping signal WE_MAP1 by inverting an output of the third NAND gate 423. The fourth inverter 429 may output the second read mapping signal RE_MAP1 by inverting an output of the fourth NAND gate 429.

Each of FIGS. 15, 16 and 17 illustrates mapping configuration between data bits input through I/O pads during burst lengths and sub array block in which the data bits are stored.

In each of FIGS. 15, 16 and 17, the sub word-line driver SWD may correspond to the sub word-line driver region SWB in FIG. 11 and a region between adjacent sub word-line drivers SWD may correspond to the sub array block SCB in FIG. 11

FIG. 15 illustrates a first mapping configuration MAPC1 between data bits input through I/O pads DQ0~DQ7 during the burst lengths BL0~BL7 and sub array block in which the data bits are stored.

Referring to FIG. 15, it is noted that the sub array block in which data bits input through I/O pads DQ0~DQ3 during the burst lengths BL0~BL7 are stored in left sub array blocks and the sub array block in which data bits input through I/O pads DQ4~DQ7 during the burst lengths BL0~BL7 are stored, are divided into left sub array blocks and right sub array blocks with respect to a virtual intermediate (e.g., central) line.

The first mapping configuration MAPC1 of FIG. 15 may be referred to as bounded fault configuration and may correspond to a first type of mapping relationship.

FIG. 16 illustrates a second mapping configuration MAPC2 between data bits input through I/O pads DQ0~DQ7 during the burst lengths BL0~BL7 and sub array block in which the data bits are stored.

Referring to FIG. 16, it is noted that data bits input through I/O pads DQ0~DQ3 during the burst lengths BL0~BL7 are stored in the same sub array block corresponding to each of the I/O pads DQ0~DQ7.

The second mapping configuration MAPC2 of FIG. 16 may be referred to as I/O pad aligned configuration and may correspond to a second type of mapping relationship.

FIG. 17 illustrates a third mapping configuration MAPC3 between data bits input through I/O pads DQ0~DQ7 during the burst lengths BL0~BL7 and sub array block in which the data bits are stored.

Referring to FIG. 17, it is noted that data bits input through I/O pads DQ0~DQ3 during the burst lengths BL0~BL7 are stored in the same sub array block corresponding to each of the burst lengths BL0~BL7.

The third mapping configuration MAPC3 of FIG. 17 may be referred to as a burst length aligned configuration and may correspond to a third type of mapping relationship.

The third mapping configuration MAPC3 of FIG. 17 may be employed, for example, in non-ECC DIMM that does not include ECC memories.

FIG. 18 illustrates defects that may occur in the mapping configuration in FIG. 15.

In FIG. 18, a reference numeral 511 denotes a defect of a sub word-line driver associated with two sub array blocks and a reference numeral 511 denotes a defect of a word-line or a column selection line connected to a sub array block.

FIG. 19 illustrates errors that may occur due to the defects in FIG. 18.

Referring to FIG. 19, first errors may occur in data bits corresponding to the burst lengths BL0, BL1, BL6 and BL7 and the I/O pads DQ0, DQ1, DQ2 and DQ3 due to the defect 511 of the sub word-line driver and second errors may occur in data bits corresponding to the burst lengths BL3 and BL4 and the I/O pads DQ0, DQ1, DQ2 and DQ3 due to the defect 513 of the word-line of the column selection line.

An ECC engine employing the first mapping configuration MAPC1 of FIG. 15 may determine the first errors due to the defect 511 of the sub word-line drivers as correctable errors and an ECC engine employing the second mapping configuration MAPC2 of FIG. 16 may determine the first errors due to the defect 511 of the sub word-line drivers as uncorrectable errors. In addition, an ECC engine employing the first mapping configuration MAPC1 of FIG. 15 may determine the second errors due to the defect 513 of the word-line or the column selection line as correctable errors and an ECC engine employing the second mapping configuration MAPC2 of FIG. 16 may determine the second errors due to the defect 513 of the word-line or the column selection line as uncorrectable errors.

FIG. 20 illustrates defects that may occur in the mapping configuration in FIG. 16.

In FIG. 20, a reference numeral 521 denotes a defect of a sub word-line driver associated with two sub array blocks and a reference numeral 523 denotes a defect of a word-line or a column selection line connected to a sub array block.

FIG. 21 illustrates errors that may occur due to the defects in FIG. 20.

Referring to FIG. 21, first errors may occur in data bits corresponding to the burst lengths BL0~ BL7 and the I/O pads DQ0 and DQ2 due to the defect 521 of the sub word-line driver and second errors may occur in data bits corresponding to the burst lengths BL0~BL7 and the I/O pad DQ3 due to the defect 523 of the word-line of the column selection line.

An ECC engine employing the first mapping configuration MAPC1 of FIG. 15 may determine the first errors due to the defect 521 of the sub word-line drivers as uncorrectable errors and an ECC engine employing the second mapping configuration MAPC2 of FIG. 16 may determine the first errors due to the defect 521 of the sub word-line drivers as uncorrectable errors. In addition, an ECC engine employing the first mapping configuration MAPC1 of FIG. 15 may determine the second errors due to the defect 523 of the word-line or the column selection line as correctable errors and an ECC engine employing the second mapping configuration MAPC2 of FIG. 16 may determine the second errors due to the defect 523 of the word-line or the column selection line as correctable errors.

FIG. 22 illustrates an example of the I/O gating circuit in the data memory of FIG. 11 according to example implementations.

An I/O gating circuit 400a of FIG. 22 may be applicable to the first mapping configuration MAPC1 of FIG. 15 and the second mapping configuration MAPC2 of FIG. 16.

In addition, in FIG. 22, it is assumed that data bits are stored in first through fourth sub array blocks MAT0, MAT1, MAT2 and MAT3 arranged in the first direction D1, from among the plurality of sub array blocks in FIG. 15.

Referring to FIG. 22, the I/O gating circuit 400a may include the mapping signal generator 420, a plurality of first drivers DRIVER1 430a and a plurality of second drivers DRIVER2 450a. Although not illustrated, the I/O gating circuit 400a may further include the mapping selection signal generator 410 in FIG. 13.

One of the plurality of first drivers 430a and one of the plurality of second drivers 450a may connect a first data I/O line corresponding to one of a plurality of data I/O lines MAT0_RWD0~RWD7, MAT1_RWD0~RWD7, MAT2_RWD0~RWD7 and MAT3_RWD0~RWD7 to a first data bus and a second data bus different from each other, respectively, from among a plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7.

The first driver 430a may connect the data I/O line MAT3-RWD0 to the first data bus BUS_DQ0_BL5 according to the first mapping relationship and the second driver 450a may connect the data I/O line MAT3-RWD0 to the second data bus BUS_DQ1_BL0 according to the second mapping relationship The first data bus and the second data bus may be different from each other in each of the first through fourth sub array blocks MAT0, MAT1, MAT2 and MAT3.

The mapping signal generator 420 may provide each of the first drivers 430a with the first write mapping signal WE_MAP0 and the first read mapping signal RE_MAP0 which are activated, based on the write enable signal WE and the read enable signal RE, in response to activation of the first mapping selection signal MPSEL0. In addition, the mapping signal generator 420 may provide each of the second drivers 450a with the second write mapping signal WE_MAP1 and the second read mapping signal RE_MAP1 which are activated, based on the write enable signal WE and the read enable signal RE, in response to activation of the second mapping selection signal MPSEL1.

Therefore, each of the first drivers 430a and each of the second drivers 450a may be enabled exclusively from each other.

In response to activation of the first mapping selection signal MPSEL0, the first drivers 430a may connect the plurality of data I/O lines MAT0_RWD0~RWD7, MAT1_RWD0~RWD7, MAT2_RWD0~RWD7 and MAT3_RWD0~RWD7 to the plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7 according to the first mapping configuration MAPC1 of FIG. 15.

In response to activation of the second mapping selection signal MPSEL1, the second drivers 450a may connect the plurality of data I/O lines MAT0_RWD0~RWD7, MAT1_RWD0~RWD7, MAT2 RWD0~RWD7 and MAT3_RWD0~RWD7 to the plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7 according to the second mapping configuration MAPC2 of FIG. 16.

FIG. 23 is a circuit diagram illustrating an example of the first driver in the I/O gating circuit of FIG. 22 according to example implementations.

Referring to FIG. 23, the first driver 430a may include a first NAND gate 431, a first inverter 433, a first NOR gate 432, a first p-channel metal-oxide semiconductor (PMOS) transistor 435, a first n-channel metal-oxide semiconductor (NMOS) transistor 436, a second NAND gate 441, a second inverter 443, a second NOR gate 442, a second PMOS transistor 445, a second NMOS transistor 446.

The first NAND gate 431 is connected to a first data bus BUS_DQ0_BL5 and may perform a NAND operation on the first write mapping signal WE_MAP0 and a first data bit on the first data bus BUS_DQ0_BL5. The first inverter 433 may invert the first write mapping signal WE_MAP0. The first NOR gate 432 may perform a NOR operation on the first data bit and an output of the first inverter 433.

The first PMOS transistor 435 may be connected between a power supply voltage VDD and a first node N11 coupled to a first data I/O line MAT3_RWD0 and may have a gate receiving an output of the first NAND gate 431. The first NMOS transistor 436 may be connected between the first node N11 and a ground voltage VSS and may have a gate receiving an output of the first NOR gate 436.

The second NAND gate 441 may perform a NAND operation on the first read mapping signal RE_MAP0 and a second data bit on the first data I/O line MAT3_RWD0. The second inverter 443 may invert the first read mapping signal RE_MAP0. The second NOR gate 442 may perform a NOR operation on the second data bit and an output of the second inverter 443.

The second PMOS transistor 445 may be connected between the power supply voltage VDD and a second node N12 coupled to the first data bus BUS_DQ0_BL5 and may have a gate receiving an output of the second NAND gate 441. The second NMOS transistor 446 may be connected between the second node N12 and the ground voltage VSS and may have a gate receiving an output of the second NOR gate 443.

Therefore, when the first write mapping signal WE_MAP0 is activated in a write operation, a logic level of the first node N11 is the same as a logic level of the first data bit and when the first read mapping signal RE_MAP0 is activated in a read operation, a logic level of the second node N12 is the same as a logic level of the second data bit.

In addition, when the first write mapping signal WE_MAP0 is deactivated with a low level, the first node N11 is in a floating state because the first PMOS transistor 435 and the first NMOS transistor 436 are turned-off and when the first read mapping signal RE_MAP0 is deactivated with a low level, the second node N12 is in a floating state because the second PMOS transistor 445 and the second NMOS transistor 446 are turned-off.

FIG. 24 is a circuit diagram illustrating an example of the second driver in the I/O gating circuit of FIG. 22 according to example implementations.

Referring to FIG. 24, the second driver 450a may include a first NAND gate 451, a first inverter 453, a first NOR gate 452, a first PMOS transistor 455, a first NMOS transistor 456, a second NAND gate 461, a second inverter 463, a second NOR gate 462, a second PMOS transistor 465, a second NMOS transistor 466.

The first NAND gate 451 is connected to a second data bus BUS_DQ0_BL0 and may perform a NAND operation on the second write mapping signal WE_MAP1 and a first data bit on the second data bus BUS_DQ0_BL0. The first inverter 453 may invert the second write mapping signal WE_MAP1. The first NOR gate 452 may perform a NOR operation on the first data bit and an output of the first inverter 453.

The first PMOS transistor 455 may be connected between the power supply voltage VDD and a first node N21 coupled to the first data I/O line MAT3_RWD0 and may have a gate receiving an output of the second NAND gate 451. The first NMOS transistor 456 may be connected between the first node N21 and the ground voltage VSS and may have a gate receiving an output of the first NOR gate 456.

The second NAND gate 461 may perform a NAND operation on the second read mapping signal RE_MAP1 and a second data bit on the first data I/O line MAT3_RWD0. The second inverter 463 may invert the second read mapping signal RE_MAP1. The second NOR gate 462 may perform a NOR operation on the second data bit and an output of the second inverter 463.

The second PMOS transistor 465 may be connected between the power supply voltage VDD and a second node N22 coupled to the second data bus BUS_DQ0_BL0 and may have a gate receiving an output of the second NAND gate 461. The second NMOS transistor 466 may be connected between the second node N22 and the ground voltage VSS and may have a gate receiving an output of the second NOR gate 463.

Therefore, when the second write mapping signal WE_MAP1 is activated in a write operation, a logic level of the first node N21 is the same as a logic level of the first data bit and when the second read mapping signal RE_MAP1 is activated in a read operation, a logic level of the second node N22 is the same as a logic level of the second data bit.

In addition, when the second write mapping signal WE_MAP1 is deactivated with a low level, the first node N21 is in a floating state because the first PMOS transistor 455 and the first NMOS transistor 456 are turned-off and when the second read mapping signal RE_MAP1 is deactivated with a low level, the second node N22 is in a floating state because the second PMOS transistor 465 and the second NMOS transistor 466 are turned-off.

FIG. 25 illustrates an example of the I/O gating circuit in the data memory of FIG. 11 according to example implementations.

An I/O gating circuit 400b of FIG. 25 may be applicable to the first mapping configuration MAPC1 of FIG. 15 and the third mapping configuration MAPC3 of FIG. 17.

In addition, in FIG. 25, it is assumed that data bits are stored in first through fourth sub array blocks MAT0, MAT1, MAT2 and MAT3 arranged in the first direction D1, from among the plurality of sub array blocks in FIG. 15.

Referring to FIG. 25, the I/O gating circuit 400c may include the mapping signal generator 420, a plurality of first drivers DRIVER1 430b, a plurality of second drivers DRIVER2 450b and a plurality of third drivers DRIVER1 470b. Although not illustrated, the I/O gating circuit 400c may further include the mapping selection signal generator 410 in FIG. 13.

One of the plurality of first drivers 430b and one of the plurality of second drivers 450b may connect a first data I/O line corresponding one of a plurality of data I/O lines MAT0_RWD0~RWD7, MAT1_RWD0~RWD7, MAT_RWD0~RWD7 and MAT3_RWD0~RWD7 to a first data bus and a second data bus different from each other, respectively, from among a plurality of data buses BUS_DQ0_BL0~BUS_DQ0_BL7, BUS_DQ1_BL0~BUS_DQ1_BL7, BUS DQ2_BL0~BUS_DQ2 BL7 and BUS_DQ3_BL0~BUS_DQ3_BL7.

One of the plurality of third drivers 470b may connect a second data I/O line different from the first data I/O line, from among the plurality of data I/O lines MAT0_RWD0~RWD7, MAT1_RWD0~RWD7, MAT2_RWD0~RWD7 and MAT3_RWD0~RWD7 to a third data bus different from the first data bus and the second data bus, from among the plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7.

Configuration of each of the first drivers 430b may be substantially the same as the configuration of the first driver 430a of FIG. 23 and configuration of each of the second drivers 450b may be substantially the same as the configuration of the second driver 450b of FIG. 24.

Each of the first drivers 430b and each of the second drivers 450b may be enabled exclusively from each other, and each of the third drivers 470b may be enabled in parallel with each of the first drivers 430b and each of the second drivers 450b.

The first data bus and the second data bus may be different from each other in two adjacent sub array blocks from among the first through fourth sub array blocks MAT0, MAT1, MAT2 and MAT3. The third data bus may be different in each of the first through fourth sub array blocks MAT0, MAT1, MAT2 and MAT3.

In response to activation of the first mapping selection signal MPSEL0, the first drivers 430b and the third driver 470b may connect the plurality of data I/O lines MAT0_RWD0~RWD7, MAT1_RWD0~RWD7, MAT2_RWD0~RWD7 and MAT3_RWD0~RWD7 to the plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7 according to the first mapping configuration MAPC1 of FIG. 15.

In response to activation of the second mapping selection signal MPSEL1, the second drivers 450b and the third driver 470b may connect the plurality of data I/O lines MAT0_RWD0~RWD7, MAT1_RWD0~RWD7, MAT2_RWD0~RWD7 and MAT3_RWD0~RWD7 to the plurality of data buses BUS_DQ0_BL0~BUS_DQ0_BL7, BUS_DQ1_BL0~BUS_DQ1_BL7, BUS_DQ2_BL0~BUS_DQ2_BL7 and BUS_DQ3_BL0~BUS_DQ3_BL7 according to the third mapping configuration MAPC3 of FIG. 17.

FIG. 26 is a circuit diagram illustrating an example of the third driver in the I/O gating circuit of FIG. 25 according to example implementations.

Referring to FIG. 26, the third driver 470b may include a first NAND gate 471, a first inverter 473, a first NOR gate 472, a first PMOS transistor 475, a first NMOS transistor 476, a second NAND gate 481, a second inverter 483, a second NOR gate 482, a second PMOS transistor 485, a second NMOS transistor 486.

The first NAND gate 471 is connected to a third data bus BUS_DQ0_BL1 and may perform a NAND operation on the write enable signal WE and a first data bit on the third data bus BUS_DQ0_BL1. The first inverter 473 may invert the second write enable signal WE. The first NOR gate 472 may perform a NOR operation on the first data bit and an output of the first inverter 473.

The first PMOS transistor 475 may be connected between the power supply voltage VDD and a first node N31 coupled to a third data I/O line MAT3_RWD4 and may have a gate receiving an output of the second NAND gate 471. The first NMOS transistor 476 may be connected between the first node N31 and the ground voltage VSS and may have a gate receiving an output of the first NOR gate 476.

The second NAND gate 481 may perform a NAND operation on the read enable signal RE and a second data bit on the third data I/O line MAT3_RWD4. The second inverter 483 may invert the second read enable signal RE. The second NOR gate 482 may perform a NOR operation on the second data bit and an output of the second inverter 483.

The second PMOS transistor 485 may be connected between the power supply voltage VDD and a second node N32 coupled to the third data bus BUS_DQ0_BL2 and may have a gate receiving an output of the second NAND gate 481. The second NMOS transistor 486 may be connected between the second node N32 and the ground voltage VSS and may have a gate receiving an output of the second NOR gate 483.

Therefore, when the write enable signal WE is activated in a write operation, a logic level of the first node N31 is the same as a logic level of the first data bit and when the read enable signal RE is activated in a read operation, a logic level of the second node N32 is the same as a logic level of the second data bit.

In addition, when the write enable signal WE is deactivated with a low level, the first node N31 is in a floating state because the first PMOS transistor 475 and the first NMOS transistor 476 are turned-off and when the read enable signal RE is deactivated with a low level, the second node N32 is in a floating state because the second PMOS transistor 485 and the second NMOS transistor 486 are turned-off.

Therefore, since the semiconductor memory device according to example implementations may program mapping configuration which the CPU uses in the I/O gating circuit based on the identifier information of the CPU of the memory controller, the data memory may handle at least two different mapping configuration with one core structure and may reduce uncorrectable errors detected by an ECC engine of the memory controller.

FIG. 27 is a block diagram illustrating an example of the memory module in the memory system of FIG. 1 according to example implementations.

Referring to FIG. 27, a memory module 180a includes a register clock driver (RCD) 510 disposed (or mounted) in a module board 181, a plurality of first data memories 201a~201h, a parity memory 200ta, a CRC memory 200tb, a plurality of second data memories 202a~202h, a plurality of data buffers 541~550 and 551~560, an SPD chip 190 and a power management integrated circuit (PMIC) 580. The first data memories 201a~201h correspond to first through eighth data memories and the second data memories 202a~202h correspond to ninth through sixteenth data memories.

Each of the first data memories 201a~201h, the parity memory 200ta, the CRC memory 200tb, and each of the second data memories 202a~202h may be referred to as a semiconductor memory device or a memory device.

The module board 181 which is a printed circuit board may extend to a first direction D1, perpendicular to a second direction D2, between a first edge portion 183 and a second edge portion 185 of the second direction D2.

The RCD 510 may control the memory devices and the PMIC 580 under control of the memory controller 50. The RCD 510 may receive a command CMD, an address ADDR and the clock signal CLK from the memory controller 50.

In response to received signals, the RCD 510 may control the memory devices such that data received through a data signal DT and a data strobe signal DQS is written in the memory devices or such that data stored in the memory devices is outputted through the data signal DT and the data strobe signal DQS. For example, the RCD 510 may transmit the address ADDR, the command CMD, and the clock signal CLK from the memory controller 50 to the memory devices.

The SPD chip 190 may be a programmable read only memory (e.g., EEPROM). The SPD chip 190 may include initial information or device information DI of the memory module 180a. In example implementations, the SPD chip 190 may include the initial information or the device information DI such as a module form, a module configuration, a storage capacity, a module type, an execution environment, and the like of the memory module 180a.

When the memory system including the memory module 180a is booted up, the memory controller 50 may read the device information DI from the SPD chip 190 and may recognize the memory module 180a based on the device information DI. The memory controller 50 may control the memory module 180a based on the device information DI from the SPD chip 190.

The PMIC 580 may receive an input voltage VIN, may generate a power supply voltage VDD based on the input voltage VIN and may provide the power supply voltage VDD to the memory devices. The memory devices operate based on the power supply voltage VDD.

The RCD 410 may be disposed on a center of the module board 181. The first data memories 201a~201h, the parity memory 200ta and the CRC memory 200tb may be arranged between the RCD 510 and the first edge portion 183 and the second data memories 202a~202h may be arranged between the RCD 510 and the second edge portion 185.

Each of the first data memories 201a~201h may be coupled to corresponding one of the data buffers 541~548 through data transmission line for receiving/transmitting the data signal DT and the data strobe signal DQS. The parity memory 200ta may be coupled to the data buffer 549 for receiving/transmitting a parity data PRT1. The CRC memory 200tb may be coupled to the data buffer 550 for receiving/transmitting a CRC data CRCd. Each of the second data memories 202a~202h may be coupled to corresponding one of the data buffers 551~558 through data transmission line for receiving/transmitting the data signal DT and the data strobe signal DQS.

The RCD 510 may provide a command/address signal to the first data memories 201a~201h, the parity memory 200ta and the CRC memory 200tb through a command/address transmission line 531 and may provide a command/address signal to the second data memories 202a~202h through a command/address transmission line 533.

The SPD chip 190 is disposed to be adjacent to the RCD 510 and the PMIC 580 may be disposed adjacent to the second edge portion 185.

FIG. 28 is a block diagram illustrating a memory system according to example implementations.

Referring to FIG. 28, a memory system 20a may include a memory controller 50a and a semiconductor memory device 205.

Operation of the memory controller 50a may be similar with an operation of the memory controller 50 in FIG. 1. The memory controller 50a may apply a command CMD and address ADDR to the semiconductor memory device 205 and may exchange a user data DQ_BL and a parity data PRT with the semiconductor memory device 205. The memory controller 50a may include a CPU 60a and an ECC engine 100a. The memory controller 50a may transmit identifier information CIDIN to the semiconductor memory device 205. The identifier information CIDIN may include information on a type of the CPU 60a, a manufacturer of the CPU 60a, and/or other information characterizing the CPU 60a.

The ECC engine 100a may apply the user data DQ_BL and the parity data PRT to the semiconductor memory device 205 in a write operation and in a read operation, may receive the user data DQ_BL and the parity data PRT from the semiconductor memory device 205 and may perform an ECC decoding based on the user data DQ_BL and the parity data PRT.

The semiconductor memory device 205 may include a memory cell array 300, a control logic circuit 210a, a data I/O buffer 295a and an I/O gating circuit 401.

Configuration and operation of each of the memory cell array 300, the control logic circuit 210a, the data I/O buffer 295a and the I/O gating circuit 401 may be same as or similar with configuration and operation of each of the memory cell array 310, the control logic circuit 210, the data I/O buffer 295 and the I/O gating circuit 400 in FIG. 7.

The I/O gating circuit 401 may be connected to the memory cell array 300 through a plurality of data I/O lines RWDIO and may be connected to the data I/O buffer 295a through a plurality of data buses DQ BUS.

The control logic circuit 210a may generate the mapping control signal MPCS based on the identifier information CIDIN from the memory controller 50a and may provide the mapping control signal MPCS to the I/O gating circuit 401. The I/O gating circuit 401 may program mapping relationship between a plurality of sub array blocks in the memory cell array 300 and a plurality of I/O pads connected to the data I/O buffer, through which the user data is input/output, based on the mapping control signal MPCS such that uncorrectable errors that are detected by the ECC engine 100a in the memory controller 50a are reduced.

The I/O gating circuit 401 may employ the I/O gating circuit 400 of FIG. 13.

FIG. 29 is a flow chart illustrating a method of operating a semiconductor memory device according to example implementations.

Referring to FIGS. 1 through 3 and 7 through 29, in a method of operating a semiconductor memory device 200a including a memory cell array that includes a plurality of sub array blocks, the semiconductor memory device 200a receives identifier information CIDIN of the CPU 60 from the memory controller 50 (operation S210).

The I/O gating circuit 400, which is connected to the data I/O buffer 295 through a plurality of data buses and is connected to the memory cell array 310 through a plurality of data I/O lines, programs mapping relationship between I/O pads and the sub array blocks in which data bits are stored in response to the mapping control signal MPCS based on the identifier information CIDIN (operation S230).

The control logic circuit 210 inputs/outputs data based on the programmed mapping relationship such that uncorrectable errors detected by the ECC engine 100 in the memory controller 50 are reduced (operation S250).

FIG. 30 is a block diagram illustrating a memory system having quad-rank memory modules according to example implementations.

Referring to FIG. 30 a memory system 700 may include a memory controller 710 and at least one or more memory modules 720 and 730.

The memory controller 710 may control a memory module 720 and/or 730 so as to perform a command supplied from a processor or host. The memory controller 710 may be implemented in a processor or host, or may be implemented with an application processor or a system-on-a-chip (SoC).

For signal integrity, a source termination may be implemented with a resistor RTT on a bus 740 of the memory controller 710. The resistor RTT may be coupled to a power supply voltage VDDQ. The memory controller 710 may include a transmitter 711, to transmit a signal to the at least one or more memory modules 720 and 730, and a receiver 713 to receive a signal from the at least one or more memory modules 720 and 730. The memory controller 710 may include an ECC engine 715 and the ECC engine 715 may employ the ECC engine 100 FIG. 4

Therefore, the ECC engine 715 may output user data set or corrected user data set by performing an ECC decoding on the user data set, the CRC data and the parity data provided from the one or more memory modules 720 and 730 to correct errors in the user data set.

The at least one or more memory modules 720 and 730 may be referred to as a first memory module 720 and a second memory module 730. The first memory module 720 and the second memory module 730 may be coupled to the memory controller 710 through the bus 740. Each of the first memory module 720 and the second memory modules 730 may correspond to the memory module 180*a* of FIG. 27. The first memory module 720 may include at least one or more memory ranks RK1 and RK2, and the second memory module 730 may include one or more memory ranks RK3 and RK4.

Each of the first memory module 720 and the second memory module 730 may include a plurality of data memories, at least a first ECC memory and at least a second ECC memory.

Each of the plurality of data memories may employ the I/O gating circuit 400 of FIG. 13, may program mapping configuration which the CPU uses in the I/O gating circuit based on the identifier information of the CPU of the memory controller 710, may handle at least two different mapping configuration with one core structure and may reduce uncorrectable errors detected by the ECC engine 715 of the memory controller 710.

FIG. 31 is a block diagram illustrating a mobile system including a memory module according to example implementations.

Referring to FIG. 31, a mobile system 900 may include an application processor AP 910, a connectivity module 920, a memory module (MM) 950, a nonvolatile memory device 940, a user interface 930, and a power supply 970. The application processor 910 may include a memory controller (MCT) 911 and the memory controller 911 may employ an ECC engine such as the ECC engine 100 of FIG. 4.

The application processor 910 may execute applications, such as a web browser, a game application, a video player, etc. The connectivity module 920 may perform wired or wireless communication with an external device.

The memory module 950 may store data processed by the application processor 910 or operate as a working memory.

The memory module 950 may include a plurality of semiconductor memory devices (MD) 951, 952, 953, and 95*r* (where r is a positive integer greater than three).

The semiconductor memory devices 951, 952, 953, and 95*q* may include a plurality of data memories, a first ECC memory and a second ECC memory. Each of the plurality of semiconductor memory devices 951, 952, 953, and 95*q* may employ the I/O gating circuit 400 of FIG. 13, may program mapping configuration which the CPU uses in the I/O gating circuit based on the identifier information of the CPU of the memory controller 911, may handle at least two different mapping configuration with one core structure and may reduce uncorrectable errors detected by an ECC engine of the memory controller 911.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

The mobile system 900 or components of the mobile system 900 may be mounted using various types of packages.

Example implementations may be applied to various systems including a memory module and a memory controller that includes an ECC engine.

While the present disclosure has been particularly shown and described with reference to the example implementations thereof, it will be understood by those of ordinary skill in the art that various changes in form and detail may be made therein without departing from the spirit and scope of the present disclosure as defined by the following claims.

What is claimed is:

1. A memory module comprising:
a plurality of data memories, each of the plurality of data memories configured to store data included in a data set;
a first error correction code (ECC) memory configured to store cyclic redundancy check (CRC) data generated based on the data set; and
a second ECC memory configured to store parity data generated based on the data set and the CRC data,
wherein each data memory of the plurality of data memories is configured to, based on identifier information about a central processing unit (CPU) of a memory controller, set a mapping relationship between a plurality of sub array blocks of the data memory, in which the data of the data memory is stored, and a plurality of I/O pads of the data memory, through which the data memory is connected to the memory controller and the data is transferred.

2. The memory module of claim 1, wherein each data memory of the plurality of data memories includes:
a memory cell array that comprises the plurality of sub array blocks of the data memory arranged in a first direction and a second direction crossing the first direction, each of the plurality of sub array blocks including a plurality of memory cells;
a data input/output (I/O) buffer configured to exchange the data of the data memory with the memory controller through the plurality of I/O pads of the data memory;
an I/O gating circuit connected to the data I/O buffer through a plurality of data buses and connected to the memory cell array through a plurality of data I/O lines, the I/O gating circuit configured to set the mapping relationship based on a mapping control signal; and a control logic circuit configured to generate the mapping control signal based on the identifier information,
wherein the mapping relationship is associated with couplings between the plurality of data buses and the plurality of data I/O lines.

3. The memory module of claim 2, wherein:
(i) the I/O gating circuit of a first data memory of the plurality of data memories is configured to, in response to the identifier information indicating that the CPU is a first type of CPU, change the mapping relationship from a first mapping relationship to a second mapping relationship, or
(ii) wherein the I/O gating circuit of the first data memory is configured to switch the mapping relationship among three different mapping relationships, or
both (i) and (ii).

4. The memory module of claim 2, wherein the I/O gating circuit is configured to, in response to the identifier information indicating that the CPU is a first type of CPU, change the mapping relationship from a first mapping relationship to a second mapping relationship.

5. The memory module of claim 2, wherein the I/O gating circuit is configured to, in response to the identifier information indicating the CPU is a second type of CPU, switch the mapping relationship among three different mapping relationships.

6. The memory module of claim 2, wherein the I/O gating circuit includes:
a first driver circuit configured to connect a first data I/O line of the plurality of data I/O lines to a first data bus of the plurality of data buses based on the mapping relationship being set to a first mapping relationship;
a second driver circuit configured to connect the first data I/O line to a second data bus, different from the first data bus, of the plurality of data buses based on the mapping relationship being set to a second mapping relationship different from the first mapping relationship;
a mapping selection signal generation circuit configured to generate a first mapping selection signal associated with an operation of the first driver circuit and a second mapping selection signal associated with an operation of the second driver circuit, based on the mapping control signal; and
a mapping signal generation circuit configured to provide a pair of first mapping signals to the first driver circuit and configured to provide a pair of second mapping signals to the second driver circuit based on the first mapping selection signal, the second mapping selection signal, a write enable signal, and a read enable signal.

7. The memory module of claim 6, wherein the mapping signal generation circuit is configured to provide the pair of first mapping signals and the pair of second mapping signals so as to activate the first driver circuit and the second driver circuit at different times from one another.

8. The memory module of claim 6, wherein each of the plurality of sub array blocks comprises a respective different first data bus and a respective different second data bus.

9. The memory module of claim 6, wherein the pair of first mapping signals includes a first write mapping signal and a first read mapping signal, and
wherein the first driver circuit includes:
a first NAND gate configured to perform a NAND operation on the first write mapping signal and a first data bit on the first data bus;
a first inverter configured to invert the first write mapping signal;
a first NOR gate configured to perform a NOR operation on the first data bit and an output of the first inverter;
a first p-channel metal-oxide semiconductor (PMOS) transistor connected between a power supply voltage and a first node coupled to the first data I/O line, the first PMOS transistor having a gate to receive an output of the first NAND gate;
a first n-channel metal-oxide semiconductor (NMOS) transistor connected between the first node and a ground voltage, the first NMOS transistor having a gate to receive an output of the first NOR gate;
a second NAND gate configured to perform a NAND operation on the first read mapping signal and a second data bit on the first data I/O line;
a second inverter configured to invert the first read mapping signal;
a second NOR gate configured to perform a NOR operation on the second data bit and an output of the second inverter;
a second PMOS transistor connected between the power supply voltage and a second node coupled to the first data bus, the second PMOS transistor having a gate to receive an output of the second NAND gate; and
a second NMOS transistor connected between the second node and the ground voltage, the second NMOS transistor having a gate to receive an output of the second NOR gate.

10. The memory module of claim 6, wherein the pair of second mapping signals includes a second write mapping signal and a second read mapping signal, and
wherein the first driver circuit includes:
a first NAND gate configured to perform a NAND operation on the second write mapping signal and a first data bit on the second data bus;
a first inverter configured to invert the second write mapping signal;
a first NOR gate configured to perform a NOR operation on the first data bit and an output of the first inverter;
a first p-channel metal-oxide semiconductor (PMOS) transistor, connected between a power supply voltage and a first node coupled to a second data I/O line of the plurality of data I/O lines, the first PMOS transistor having a gate to receive an output of the first NAND gate;
a first n-channel metal-oxide semiconductor (NMOS) transistor, connected between the first node and a ground voltage, the first NMOS transistor having a gate to receive an output of the first NOR gate;
a second NAND gate configured to perform a NAND operation on the second read mapping signal and a second data bit on the second data I/O line;
a second inverter configured to invert the second read mapping signal;
a second NOR gate configured to perform a NOR operation on the second data bit and an output of the second inverter;
a second PMOS transistor, connected between the power supply voltage and a second node coupled to the second data bus, the second PMOS transistor having a gate to receive an output of the second NAND gate; and
a second NMOS transistor, connected between the second node and the ground voltage, the second NMOS transistor having a gate to receive an output of the second NOR gate.

11. The memory module of claim 2, wherein the I/O gating circuit includes:

a first driver circuit configured to connect a first data I/O line of the plurality of data I/O lines to a first data bus of the plurality of data buses based on the mapping relationship being set to a first mapping relationship;

a second driver circuit configured to connect the first data I/O line to a second data bus, different from the first data bus, of the plurality of data buses based on the mapping relationship being set to a second mapping relationship different from the first mapping relationship;

a third driver circuit configured to connect a second data I/O line, different from the first data I/O line, of the plurality of data I/O lines to a third data bus, different from the first data bus and the second data bus, of the plurality of data buses based on a write enable signal and a read enable signal;

a mapping selection signal generation circuit configured to generate a first mapping selection signal associated with an operation of the first driver circuit and a second mapping selection signal associated with an operation of the second driver circuit, based on the mapping control signal; and a mapping signal generation circuit configured to provide a pair of first mapping signals to the first driver circuit and configured to provide a pair of second mapping signals to the second driver circuit based on the first mapping selection signal, the second mapping selection signal, the write enable signal, and the read enable signal.

12. The memory module of claim 11, wherein the mapping signal generation circuit is configured to provide the pair of first mapping signals and the pair of second mapping signals so as to activate the first driver circuit and the second driver circuit at different times from one another, and wherein the third driver circuit is configured to be activated at a same time as the first driver circuit or the second driver circuit.

13. The memory module of claim 11, wherein two adjacent sub array blocks of the plurality of sub array blocks each comprise a respective different first data bus and a respective different second data bus.

14. The memory module of claim 11, wherein each of the plurality of sub array blocks comprises a respective different third data bus.

15. The memory module of claim 11, wherein the third driver circuit includes:

a first NAND gate configured to perform a NAND operation on the write enable signal and a first data bit on the third data bus;

a first inverter configured to invert the write enable signal;

a first NOR gate configured to perform a NOR operation on the first data bit and an output of the first inverter;

a first p-channel metal-oxide semiconductor (PMOS) transistor connected between a power supply voltage and a first node coupled to the second data I/O line, the first PMOS transistor having a gate to receive an output of the first NAND gate;

a first n-channel metal-oxide semiconductor (NMOS) transistor connected between the first node and a ground voltage, the first NMOS transistor having a gate to receive an output of the first NOR gate;

a second NAND gate configured to perform a NAND operation on the read enable signal and a second data bit on the second data I/O line;

a second inverter configured to invert the read enable signal;

a second NOR gate configured to perform a NOR operation on the second data bit and an output of the second inverter;

a second PMOS transistor connected between the power supply voltage and a second node coupled to the third data bus, the second PMOS transistor having a gate to receive an output of the second NAND gate; and a second NMOS transistor connected between the second node and the ground voltage, the second NMOS transistor having a gate to receive an output of the second NOR gate.

16. The memory module of claim 2, wherein the identifier information indicates that the CPU is a first type of CPU or a second type of CPU, and wherein, for the first type of CPU and the second type of CPU, errors due to a defect of a sub word-line driver disposed between two sub array blocks, of the plurality of sub array blocks, adjacent in the first direction are correctable errors or uncorrectable errors, respectively.

17. The memory module of claim 2, wherein the identifier information indicates that the CPU is a first type of CPU or a second type of CPU, and wherein, for the first type of CPU and the second type of CPU, errors due to a defect of a word-line of one sub array block of the plurality of sub array blocks are correctable errors or uncorrectable errors, respectively.

18. A memory system comprising:
a memory module including:
a plurality of data memories, each of the plurality of data memories configured to store data included in a data set;
a first error correction code (ECC) memory configured to store cyclic redundancy check (CRC) data generated based on the data set; and
a second ECC memory configured to store parity data generated based on the data set and the CRC data; and
a memory controller including a central processing unit (CPU), the memory controller configured to control the memory module,
wherein each data memory of the plurality of data memories is configured to, based on identifier information about the CPU of the memory controller, set a mapping relationship between a plurality of sub array blocks of the data memory, in which the data of the data memory is stored, and a plurality of I/O pads of the data memory, through which the data memory is connected to the memory controller and the data is transferred.

19. The memory system of claim 18, wherein the identifier information indicates that the CPU is a first type of CPU or a second type of CPU, and wherein, for the first type of CPU and the second type of CPU, errors due to a defect of a word-line of one sub array block of the plurality of sub array blocks are correctable errors or uncorrectable errors, respectively.

20. A memory module comprising:
a plurality of data memories, each of the plurality of data memories configured to store data included in a data set;
a first error correction code (ECC) memory configured to store cyclic redundancy check (CRC) data generated based on the data set; and
a second ECC memory configured to store parity data generated based on the data set and the CRC data,
wherein each data memory of the plurality of data memories includes"

a memory cell array including a plurality of sub array blocks arranged in a first direction and in a second direction crossing the first direction, each of the plurality of sub array blocks including a plurality of memory cells;

a data input/output (I/O) buffer configured to exchange data with a memory controller through a plurality of I/O pads;

an I/O gating circuit connected to the data I/O buffer through a plurality of data buses and connected to the memory cell array through a plurality of data I/O lines, the I/O gating circuit configured to:
receive a mapping control signal, and
based on the mapping control signal, set a mapping relationship between the plurality of sub array blocks in which the data is stored and the plurality of I/O pads through which the data is transferred; and a control logic circuit configured to generate the mapping control signal based on identifier information about a central processing unit (CPU) of the memory controller, wherein the I/O gating circuit includes:
a first driver circuit configured to connect a first data I/O line of the plurality of data I/O lines to a first data bus of the plurality of data buses based on the mapping relationship being set to a first mapping relationship; and
a second driver circuit configured to connect the first data I/O line to a second data bus, different from the first data bus, of the plurality of data buses based on the mapping relationship being set to a second mapping relationship different from the first mapping relationship.

\* \* \* \* \*